(12) United States Patent
Yu et al.

(10) Patent No.: US 11,037,828 B2
(45) Date of Patent: Jun. 15, 2021

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Shao-Ming Yu, Zhubei (TW); Tung Ying Lee, Hsinchu (TW); Wei-Sheng Yun, Taipei (TW); Fu-Hsiang Yang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/700,911

(22) Filed: Dec. 2, 2019

(65) Prior Publication Data
US 2020/0105608 A1 Apr. 2, 2020

Related U.S. Application Data

(62) Division of application No. 15/940,329, filed on Mar. 29, 2018, now Pat. No. 10,497,624.
(Continued)

(51) Int. Cl.
*H01L 21/8234* (2006.01)
*H01L 29/786* (2006.01)
(Continued)

(52) U.S. Cl.
CPC ...... *H01L 21/823431* (2013.01); *B82Y 10/00* (2013.01); *H01L 21/3086* (2013.01);
(Continued)

(58) Field of Classification Search
CPC combination set(s) only.
See application file for complete search history.

(56) References Cited

U.S. PATENT DOCUMENTS 9,236,267 B2 1/2016 De et al.
9,502,265 B1 11/2016 Jiang et al.
(Continued)

FOREIGN PATENT DOCUMENTS

KR 10-2015-0033496 A 4/2015
TW 201342580 A 10/2013
(Continued)

OTHER PUBLICATIONS

Takashi Yamazaki et al., "A Study on Selective Etching of SiGe Layers in SiGe/Si Systems for Device Applications", Materials Research Society Symposium Proceedings, 2004, vol. 795.
(Continued)

*Primary Examiner* — Herve-Louis Y Assouman
(74) *Attorney, Agent, or Firm* — McDermott Will & Emery LLP

(57) ABSTRACT

A method of manufacturing a semiconductor device includes forming a first semiconductor layer having a first composition over a semiconductor substrate, and forming a second semiconductor layer having a second composition over the first semiconductor layer. Another first semiconductor layer having the first composition is formed over the second semiconductor layer. A third semiconductor layer having a third composition is formed over the another first semiconductor layer. The first semiconductor layers, second semiconductor layer, and third semiconductor layer are patterned to form a fin structure. A portion of the third semiconductor layer is removed thereby forming a nanowire comprising the second semiconductor layer, and a conductive material is formed surrounding the nanowire. The first semiconductor
(Continued)

layers, second semiconductor layer, and third semiconductor layer include different materials.

20 Claims, 30 Drawing Sheets

Related U.S. Application Data

(60) Provisional application No. 62/565,339, filed on Sep. 29, 2017.

(51) Int. Cl.

| | | |
|---|---|---|
| *H01L 29/06* | (2006.01) | |
| *H01L 29/10* | (2006.01) | |
| *H01L 29/423* | (2006.01) | |
| *H01L 29/66* | (2006.01) | |
| *H01L 21/822* | (2006.01) | |
| *H01L 27/088* | (2006.01) | |
| *H01L 21/308* | (2006.01) | |
| *H01L 29/165* | (2006.01) | |
| *H01L 29/775* | (2006.01) | |
| *H01L 27/06* | (2006.01) | |
| *H01L 29/08* | (2006.01) | |
| *B82Y 10/00* | (2011.01) | |

(52) U.S. Cl.
CPC .. *H01L 21/8221* (2013.01); *H01L 21/823412* (2013.01); *H01L 27/0688* (2013.01); *H01L 27/0886* (2013.01); *H01L 29/068* (2013.01); *H01L 29/0649* (2013.01); *H01L 29/0653* (2013.01); *H01L 29/0673* (2013.01); *H01L 29/0847* (2013.01); *H01L 29/1054* (2013.01); *H01L 29/165* (2013.01); *H01L 29/42392* (2013.01); *H01L 29/66439* (2013.01); *H01L 29/66545* (2013.01); *H01L 29/66795* (2013.01); *H01L 29/775* (2013.01); *H01L 29/78618* (2013.01); *H01L 29/78687* (2013.01); *H01L 29/78696* (2013.01); *H01L 21/823418* (2013.01); *H01L 29/66469* (2013.01)

(56) References Cited

U.S. PATENT DOCUMENTS

| | | | |
|---|---|---|---|
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,748,404 B1* | 8/2017 | Chang | H01L 29/66772 |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2006/0001126 A1* | 1/2006 | Mouli | H01L 29/1054 257/616 |
| 2010/0187503 A1* | 7/2010 | Moriyama | H01L 29/78687 257/24 |
| 2014/0001441 A1 | 1/2014 | Kim et al. | |
| 2015/0084041 A1 | 3/2015 | Hur et al. | |
| 2015/0325481 A1 | 11/2015 | Radosavljevic et al. | |
| 2016/0043085 A1* | 2/2016 | Ching | H01L 21/823821 257/347 |
| 2016/0276483 A1 | 9/2016 | Chan et al. | |
| 2016/0293774 A1 | 10/2016 | Then et al. | |
| 2019/0067441 A1 | 2/2019 | Yang et al. | |

FOREIGN PATENT DOCUMENTS

| | | |
|---|---|---|
| TW | 201405806 A | 2/2014 |
| TW | 201729280 A | 8/2017 |

OTHER PUBLICATIONS

Wet-Chemical Etching of Silicon, MicroChemicals (2013).
Office Action issued in corresponding Korean Patent Application No. 10-2018-0078636, dated Aug. 16, 2019.
Notice of Allowance issued in related U.S. Appl. No. 15/940,329, dated Jul. 15, 2019.

* cited by examiner

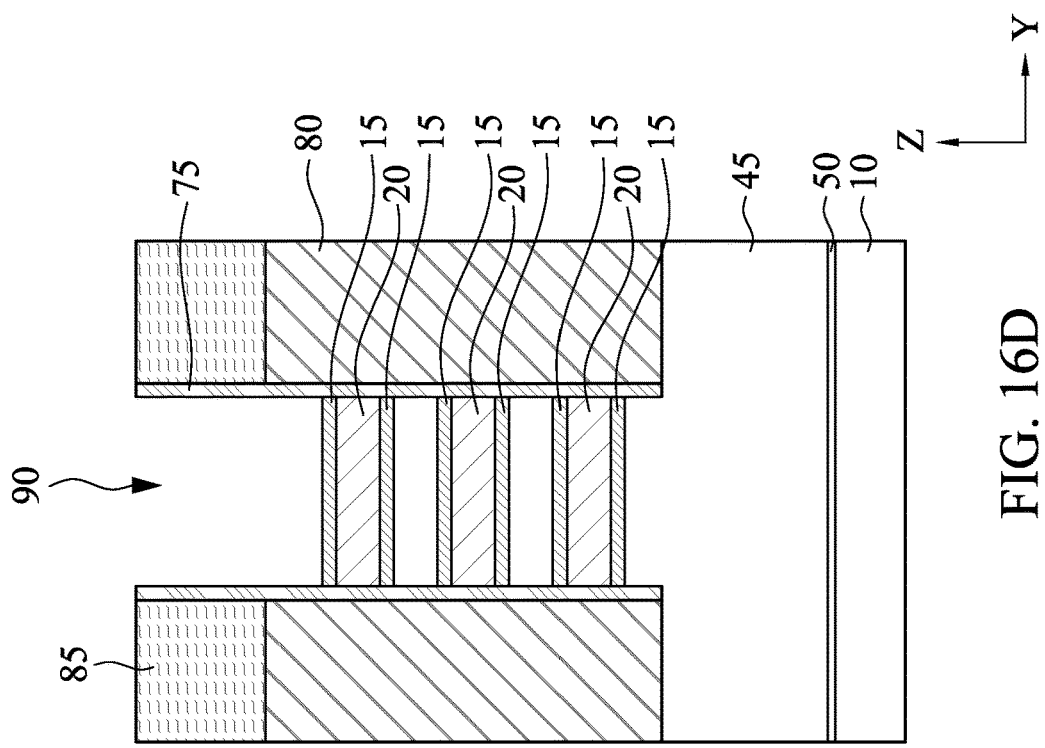
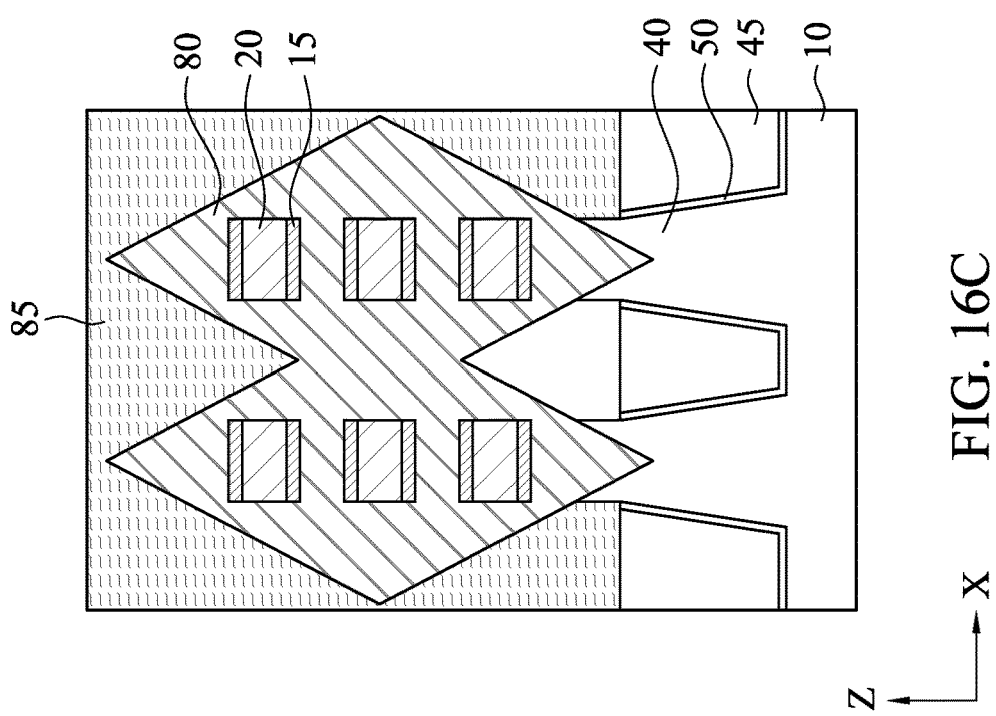
FIG. 16D
FIG. 16C

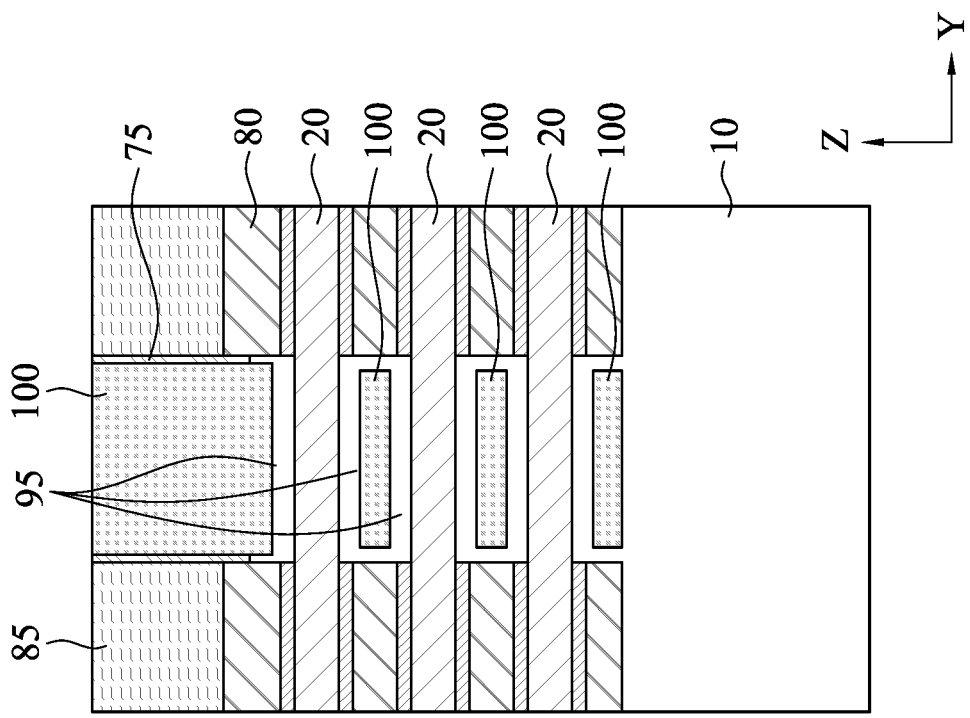
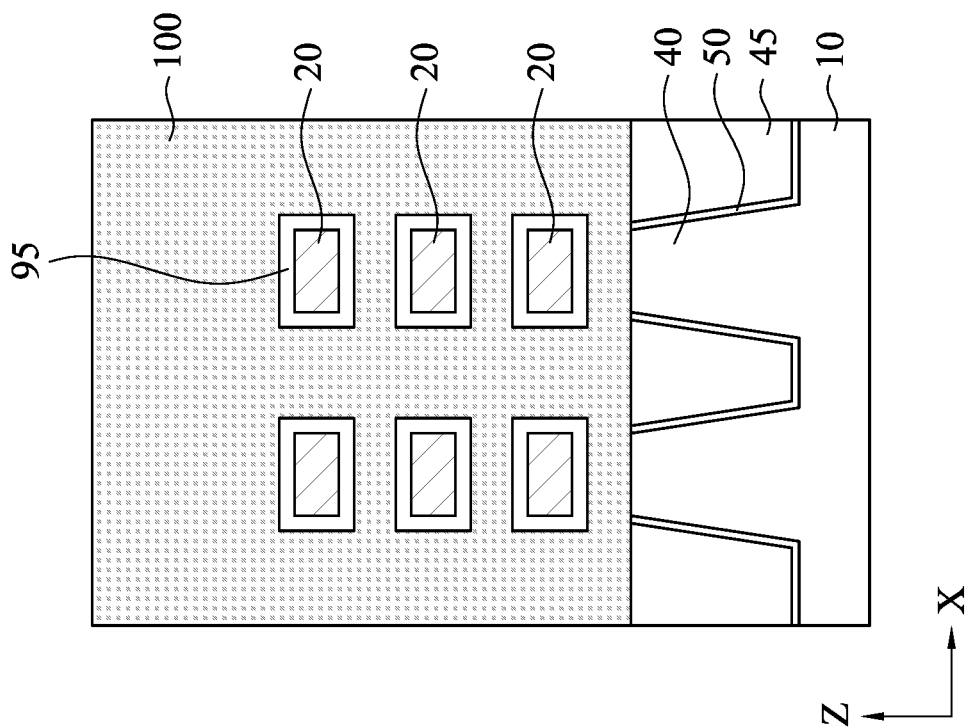
FIG. 18B
FIG. 18A

METHOD OF MANUFACTURING A SEMICONDUCTOR DEVICE AND A SEMICONDUCTOR DEVICE

CROSS-REFERENCE TO RELATED APPLICATIONS

This application is a divisional of U.S. patent application Ser. No. 15/940,329, filed Mar. 29, 2018, which claims priority to U.S. Provisional Patent Application No. 62/565,339 filed Sep. 29, 2017, the entire disclosures of each of which are incorporated herein by reference.

TECHNICAL FIELD

The disclosure relates to a method of manufacturing semiconductor integrated circuits, and more particularly to method of manufacturing semiconductor devices including fin field effect transistors (FinFETs) and/or gate-all-around (GAA) FETs, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 10A is a cross sectional view taken along the gate electrode in the X-direction (line A-A of FIG. 1). FIG. 10B is a cross sectional view taken along the fin structure in the Y-direction (line B-B of FIG. 1).

FIG. 11A is a cross sectional view taken along the gate electrode in the X-direction (line A-A of FIG. 1). FIG. 11B is a cross sectional view taken along the fin structure in the Y-direction (line B-B of FIG. 1). FIG. 11C is a cross sectional view taken along line C-C of FIG. 1. FIG. 11D is a cross sectional view taken along line D-D of FIG. 1.

FIG. 12A is a cross sectional view taken along the gate electrode in the X-direction (line A-A of FIG. 1). FIG. 12B is a cross sectional view taken along the fin structure in the Y-direction (line B-B of FIG. 1). FIG. 12C is a cross sectional view taken along line C-C of FIG. 1. FIG. 12D is a cross sectional view taken along line D-D of FIG. 1.

FIG. 13A is a cross sectional view taken along the gate electrode in the X-direction (line A-A of FIG. 1). FIG. 13B is a cross sectional view taken along the fin structure in the Y-direction (line B-B of FIG. 1). FIG. 13C is a cross sectional view taken along line C-C of FIG. 1. FIG. 13D is a cross sectional view taken along line D-D of FIG. 1.

FIG. 14A is a cross sectional view taken along the gate electrode in the X-direction (line A-A of FIG. 1). FIG. 14B is a cross sectional view taken along the fin structure in the Y-direction (line B-B of FIG. 1). FIG. 14C is a cross sectional view taken along line C-C of FIG. 1. FIG. 14D is a cross sectional view taken along line D-D of FIG. 1.

FIG. 15A is a cross sectional view taken along the gate electrode in the X-direction (line A-A of FIG. 1). FIG. 15B is a cross sectional view taken along the fin structure in the Y-direction (line B-B of FIG. 1). FIG. 15C is a cross sectional view taken along line C-C of FIG. 1. FIG. 15D is a cross sectional view taken along line D-D of FIG. 1.

FIGS. 16A-16D show one of the various stages of manufacturing a semiconductor FET device according to embodiments of the present disclosure. FIG. 16A is a cross sectional view taken along the gate electrode in the X-direction (line A-A of FIG. 1). FIG. 16B is a cross sectional view taken along the fin structure in the Y-direction (line B-B of FIG. 1). FIG. 16C is a cross sectional view taken along line C-C of FIG. 1. FIG. 16D is a cross sectional view taken along line D-D of FIG. 1.

FIG. 17A is a cross sectional view taken along the gate electrode in the X-direction (line A-A of FIG. 1). FIG. 17B is a cross sectional view taken along the fin structure in the Y-direction (line B-B of FIG. 1). FIG. 17C is a cross sectional view taken along line C-C of FIG. 1. FIG. 17D is a cross sectional view taken along line D-D of FIG. 1.

FIGS. 18A-18D show one of the various stages of manufacturing a semiconductor FET device according to embodiments of the present disclosure. FIG. 18A is a cross sectional view taken along the gate electrode in the X-direction (line A-A of FIG. 1). FIG. 18B is a cross sectional view taken along the fin structure in the Y-direction (line B-B of FIG. 1). FIG. 18C is a cross sectional view taken along line C-C of FIG. 1. FIG. 18D is a cross sectional view taken along line D-D of FIG. 1.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the present disclosure, a method for fabricating a GAA FET and a stacked channel FET are provided. It is noted that in the present disclosure, a source and a drain are interchangeably used and the structures thereof are substantially the same.

Figure 1:
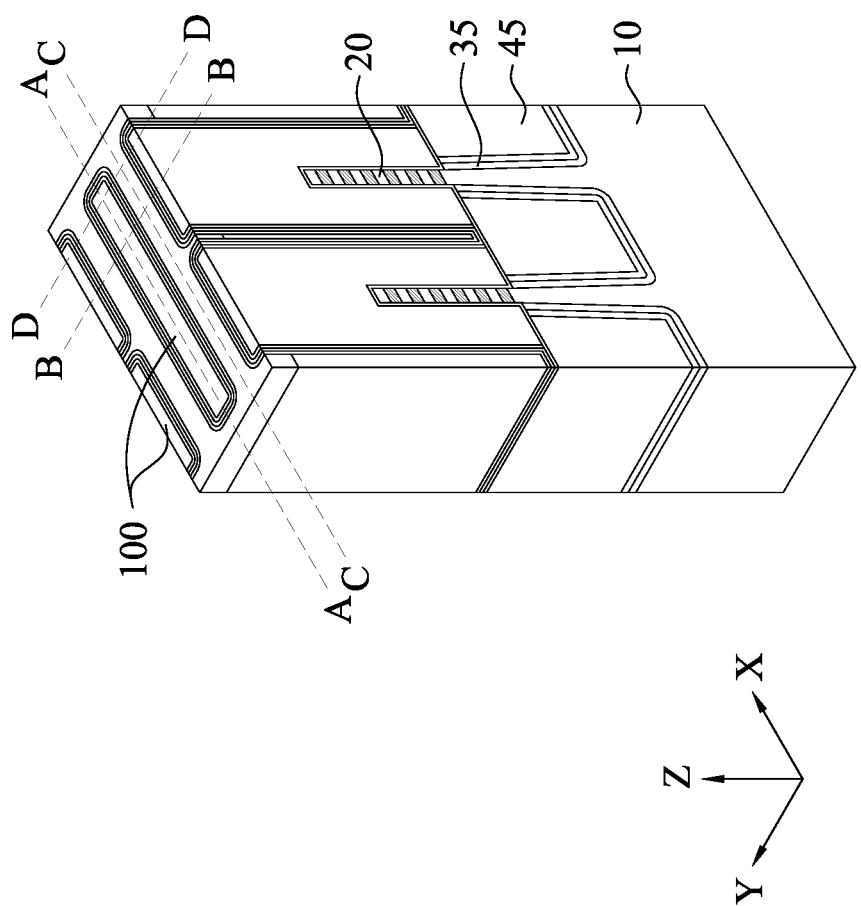
FIG. 1 shows an isometric view of a GAA FET semiconductor device showing one of the stages of a manufacturing process according to an embodiment of the present disclosure.

FIG. 1 shows an isometric view of a GAA FET semiconductor device showing one of the stages of a manufacturing process according to an embodiment of the present disclosure. One or more gate electrodes 100 extending in the X-direction are disposed over one or more fin structures 35 extending in the Y-direction. The X-direction is substantially perpendicular to the Y-direction. The fin structures 35 are formed on a semiconductor substrate 10. A lower portion of the fin structure 35 is embedded in an isolation insulating layer 45, and the gate electrode 100 wraps around semiconductor nanowires 20.

FIGS. 2-18F show exemplary sequential processes for manufacturing a GAA FET according to embodiments of the present disclosure. It is understood that additional operations can be provided before, during, and after processes shown by FIGS. 2-18F, and some of the operations described below can be replaced or eliminated, for additional embodiments of the method. The order of the operations/processes may be interchangeable.

Figure 2:
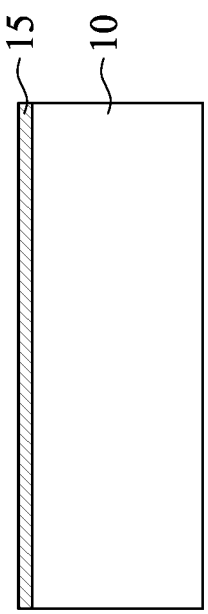
FIG. 2 shows a cross sectional view of one of the various stages of manufacturing a semiconductor FET device according to embodiments of the present disclosure.

FIG. 2 shows a cross sectional view of one of the various stages of manufacturing a semiconductor FET device according to embodiments of the present disclosure. As shown in FIG. 2, a semiconductor substrate 10 is provided. In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP.

As shown in FIG. 2, impurity ions (dopants) 12 are implanted into a silicon substrate 10 to form a well region.

The ion implantation is performed to prevent a punch-through effect. The substrate 10 may include various regions that have been suitably doped with impurities (e.g., p-type or n-type conductivity). The dopants 12 are, for example, boron ($BF_2$) for an n-type Fin FET and phosphorus for a p-type Fin FET.

Figure 3:
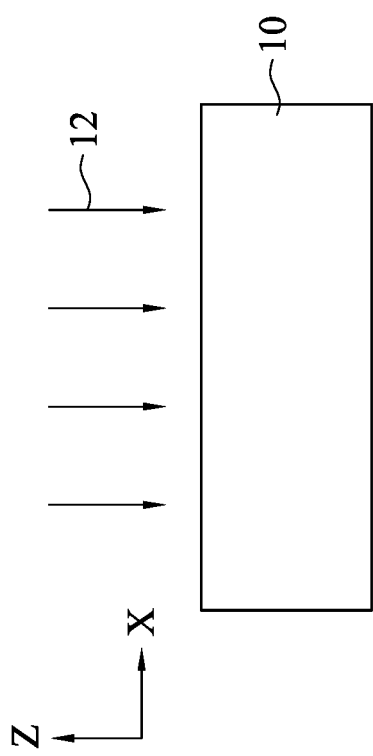
FIG. 3 shows a cross sectional view of one of the various stages of manufacturing a semiconductor FET device according to embodiments of the present disclosure.

Then, as shown in FIG. 3, a first semiconductor layer 15 is formed over the substrate 10. In some embodiments, the first semiconductor layer 15 is formed of a first semiconductor material. In some embodiments, the first semiconductor material includes a first Group IV element and a second Group IV element. The Group IV elements are selected from the group consisting of C, Si, Ge, Sn, and Pb. In some embodiments, the first Group IV element is Si and the second Group IV element is Ge. In certain embodiments, the first semiconductor material is $Si_{1-x}Ge_x$, wherein $0.3 \leq x \leq 0.9$, and in other embodiments, $0.4 \leq x \leq 0.7$.

Figure 4:
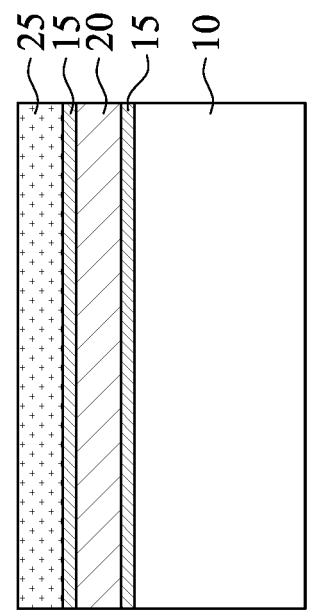
FIG. 4 shows a cross sectional view of one of the various stages of manufacturing a semiconductor FET device according to embodiments of the present disclosure.

A second semiconductor layer 20 is subsequently formed over the first semiconductor layer 15, as shown in FIG. 4. In some embodiments, the second semiconductor layer 20 is formed of a second semiconductor material. In some embodiments, the second semiconductor material includes a first Group IV element and a second Group IV element. In some embodiments, the first Group IV element is Si and the second Group IV element is Ge. In some embodiments, the amounts of the first Group IV element and second Group IV element are different in the second semiconductor material than in the first semiconductor material. In some embodiments, the amount of Ge in the first semiconductor material is greater than the amount of Ge in the second semiconductor material. In certain embodiments, the second semiconductor material is $Si_{1-y}Ge_y$, wherein $0.1 \leq y \leq 0.5$, and x>y, and in other embodiments, $0.2 \leq y \leq 0.4$.

Figure 5:
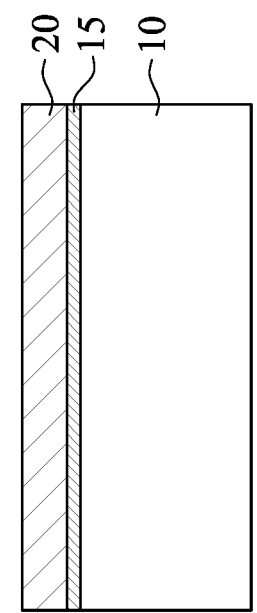
FIG. 5 shows a cross sectional view of one of the various stages of manufacturing a semiconductor FET device according to embodiments of the present disclosure.

Next, as shown in FIG. 5, another first semiconductor layer 15 is formed over the second semiconductor layer 20. The another first semiconductor layer 15 is formed of the same semiconductor material as disclosed above with reference to FIG. 3. A third semiconductor layer 25 is formed over the another first semiconductor layer 15. In some embodiments, the third semiconductor layer 25 is made of a Group IV element. In some embodiments, the third semiconductor layer 25 is made of the same material as the substrate 10.

The first semiconductor layer 15, second semiconductor layer 20, and the third semiconductor layer 25 are made of materials having different lattice constants in some embodiments, and may include one or more layers of Si, Ge, SiGe, GaAs, InSb, GaP, GaSb, InAlAs, InGaAs, GaSbP, GaAsSb or InP. In some embodiments, the first semiconductor layers 15, second semiconductor layer 20, and third semiconductor layers 25 are made of different materials. In one embodiment, the first semiconductor layers 15 are made of $Si_{1-x}Ge_x$, where $0.3 \leq x \leq 0.7$, the second semiconductor layer 20 is made of $Si_{1-y}Ge_y$, where $0.2 \leq y \leq 0.5$, where x>y, and the third semiconductor layer 25 is made of Si.

In some embodiments, a thickness of the first semiconductor layer 15 is about 0.5 nm to about 5 nm, a thickness of the second semiconductor layer 20 is about 3 nm to about 20 nm, and a thickness of the third semiconductor layer 25 is about 2 nm to about 18 nm. In other embodiments, a thickness of the first semiconductor layer 15 is about 0.5 nm to about 2 nm, a thickness of the second semiconductor layer 20 is about 5 nm to about 15 nm, and a thickness of the third semiconductor layer 25 is about 3 nm to about 12 nm. In some embodiments, the thickness of second semiconductor layer 20 is greater than the thickness of the third semiconductor layer 25, and the thickness of the third semiconductor layer 25 is greater than the thickness of the first semiconductor layer 15.

The first semiconductor layer 15, second semiconductor layer 20, and third semiconductor layer 25 may be formed by one or more epitaxy or epitaxial (epi) processes. The epitaxy processes include CVD deposition techniques (e.g., vapor-phase epitaxy (VPE) and/or ultra-high vacuum CVD (UHV-CVD)), molecular beam epitaxy, and/or other suitable processes.

Figure 6B:
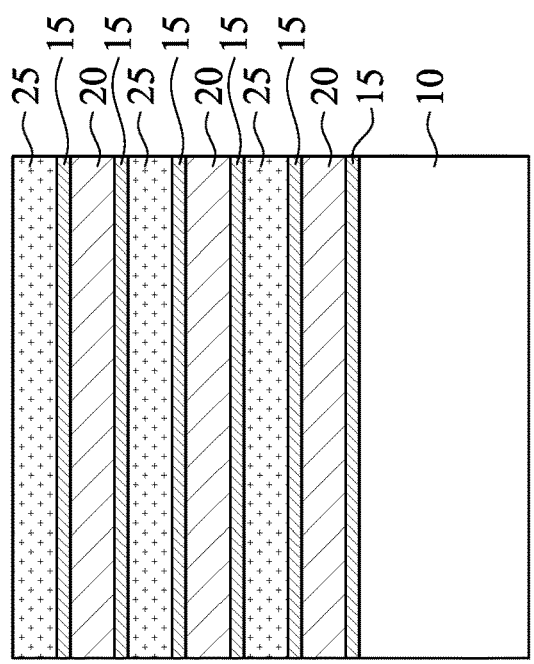
FIGS. 6A, 6B, and 6C show cross sectional views of one of the various stages of manufacturing a semiconductor FET device according to embodiments of the present disclosure.
Figure 6A:
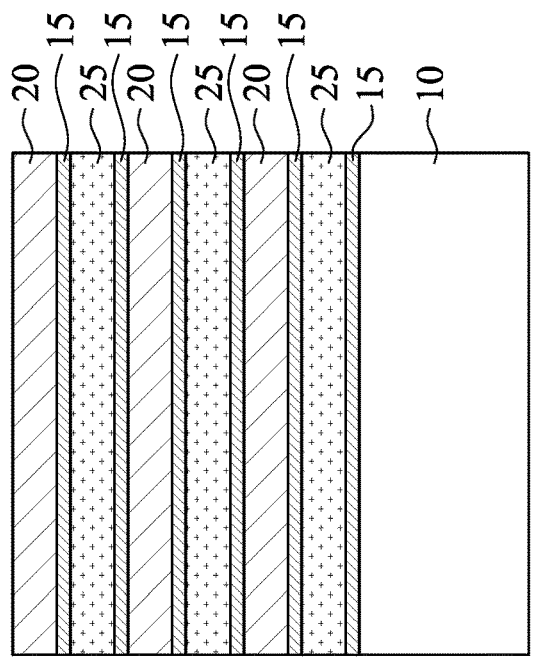

Next, in some embodiments, additional first semiconductor layers (A) 15, second semiconductor layers (B) 20, and third semiconductor layers (C) 25 are stacked in a repeating sequence ABAC, as shown in FIG. 6A. In FIG. 6A, three repeating sequences ABAC of semiconductor layers are shown, however, the number of the repeating sequences are not limited to three, and may be as small as 1 (each layer) and in some embodiments, 2-10 repeating sequences ABAC are formed. In other embodiments, repeating sequences of ACAB are formed, as shown in FIG. 3B. By adjusting the numbers of the stacked layers, a driving current of the GAA FET device can be adjusted.

Figure 6C:
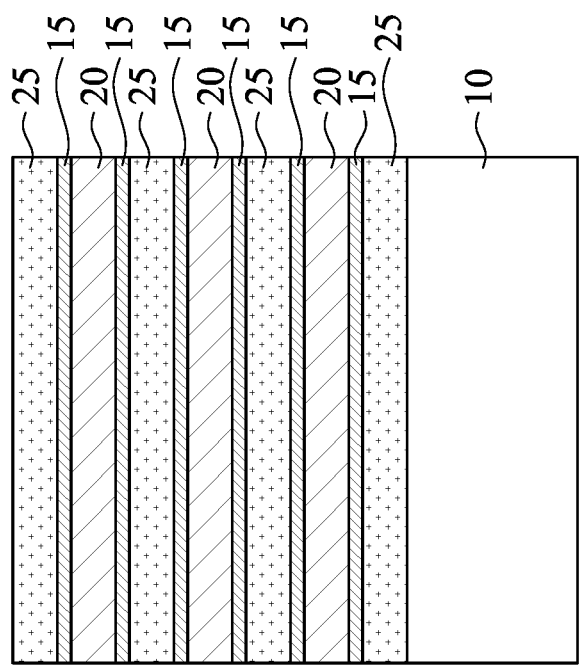

In some embodiments where the substrate 10 is made of a different material than the third semiconductor layers 25, the bottommost semiconductor layer formed on the substrate 10 is a third semiconductor layer (C) 25. After forming an initial layer third semiconductor layer (C) 25, repeating sequences ABAC of the first semiconductor layer (A) 15, second semiconductor layer (B) 20, first semiconductor layer (A) 15, third semiconductor layer (C) 25, are formed, as shown in FIG. 6C.

Figure 7:
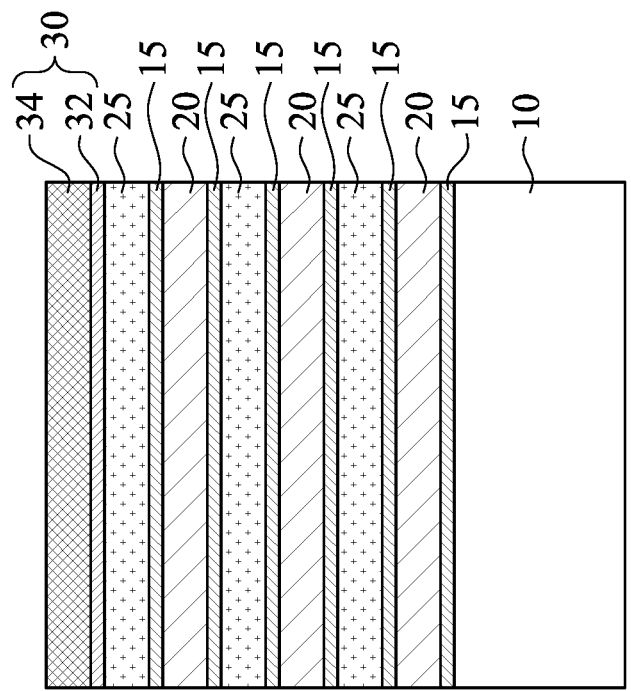
FIG. 7 shows a cross sectional view of one of the various stages of manufacturing a semiconductor FET device according to embodiments of the present disclosure.

In some embodiments, a mask layer 30 is formed over the uppermost semiconductor layer, as shown in FIG. 7. The mask layer 30 includes a first mask layer 32 and a second mask layer 34. The first mask layer 32 is a pad oxide layer made of a silicon oxide, which can be formed by a thermal oxidation or chemical vapor deposition (CVD). The second mask layer 34 is made of a silicon nitride, which is formed by CVD, including low pressure CVD (LPCVD) and plasma enhanced CVD (PECVD), physical vapor deposition (PVD), atomic layer deposition (ALD), or other suitable process. The mask layer 30 is patterned into a mask pattern by using patterning operations including photolithography and etching.

Figure 8:
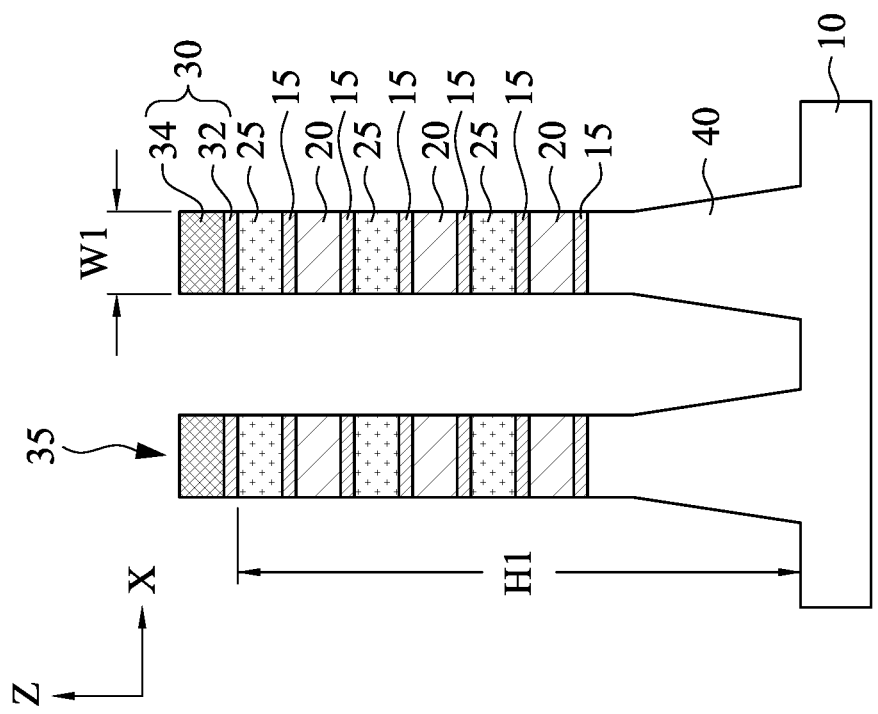
FIG. 8 shows a cross sectional view of one of the various stages of manufacturing a semiconductor FET device according to embodiments of the present disclosure.

Next, as shown in FIG. 8, the stacked layers of the first, second, and third semiconductor layers 15, 20, 25 are patterned by using the patterned mask layer, thereby the stacked layers are formed into fin structures 35 extending in the Y direction. In FIG. 8, two fin structures 35 are arranged in the X direction. But the number of the fin structures is not limited to two, and may be as small as one and three or more. In some embodiments, one or more dummy fin structures are formed on both sides of the fin structures 35 to improve pattern fidelity in the patterning operations. As shown in FIG. 8, the fin structures 35 have upper portions constituted by the stacked semiconductor layers 15, 20, 25 and well portions 40.

The width W1 of the upper portion of the fin structure 35 along the X direction is in a range from about 5 nm to about 40 nm in some embodiments, and is in a range from about 10 nm to about 30 nm in other embodiments. The height H1 along the Z direction of the fin structure is in a range from about 100 nm to about 200 nm in some embodiments.

The stacked fin structure 35 may be patterned by any suitable method. For example, the structures may be patterned using one or more photolithography processes, including double-patterning or multi-patterning processes.

Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 35.

After the fin structures 35 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost third semiconductor layer 25 is exposed from the insulating material layer. In some embodiments, a fin liner layer 50 is formed over the fin structures before forming the insulating material layer. The fin liner layer 50 is made of $Si_3N_4$ or a silicon nitride-based material (e.g., SiON, SiCN, or SiOCN).

In some embodiments, the fin liner layers 50 include a first fin liner layer formed over the substrate 10 and sidewalls of the bottom part of the fin structures 35, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Figure 9:
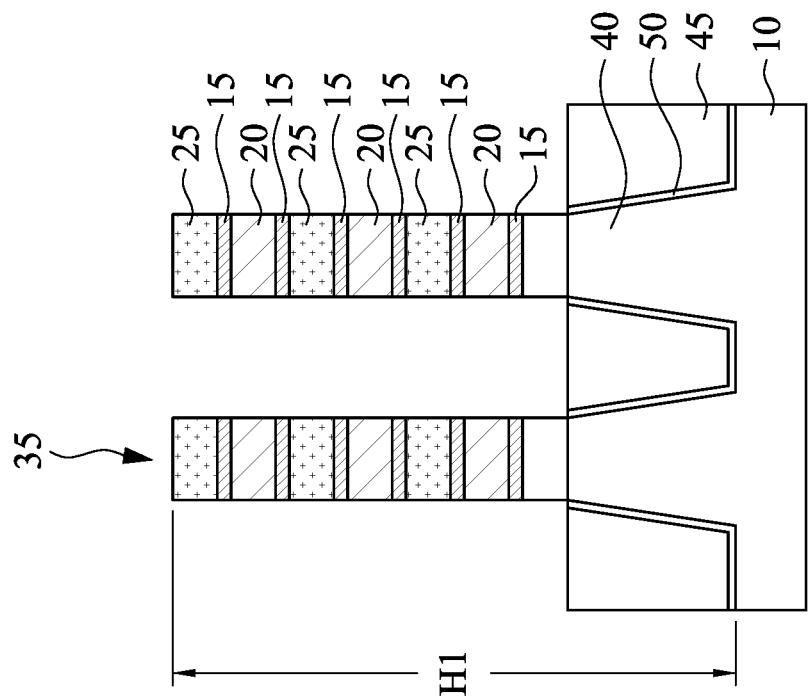
FIG. 9 shows a cross sectional view of one of the various stages of manufacturing a semiconductor FET device according to embodiments of the present disclosure.

Then, as shown in FIG. 9, the insulating material layer is recessed to form an isolation insulating layer 45 so that the upper portions of the fin structures 35 are exposed. With this operation, the fin structures 35 are electrically separated from each other by the isolation insulating layer 45, which is also called a shallow trench isolation (STI).

In the embodiment shown in FIG. 9, the insulating material layer 45 is recessed until the upper portion of the well region 40 is exposed. In other embodiments, the upper portion of the well region 40 is not exposed.

Figure 10B:
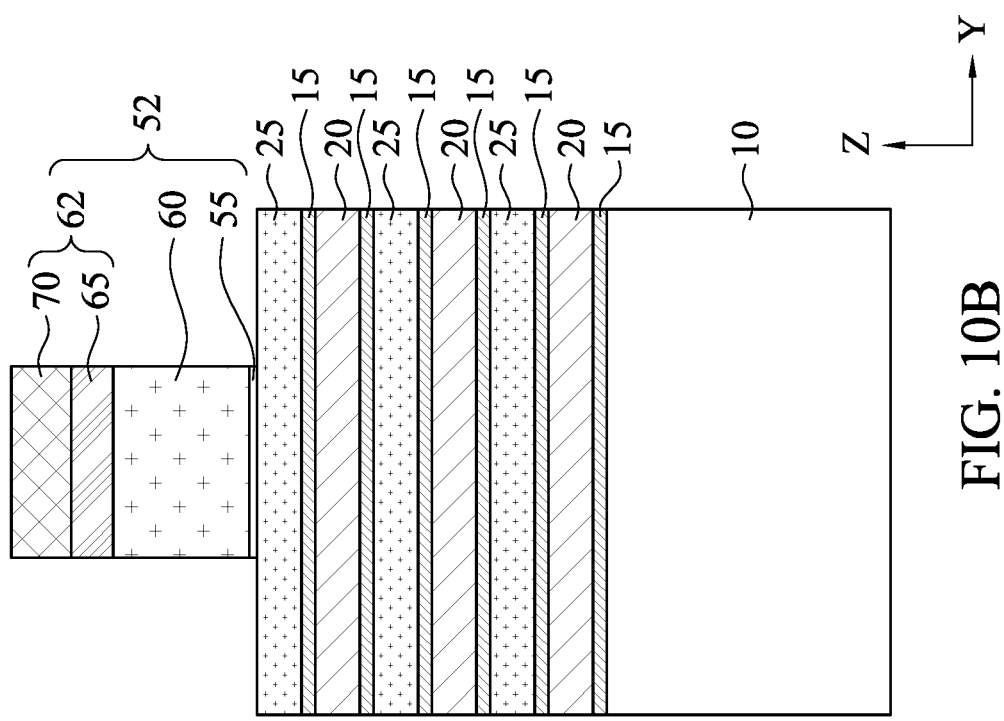
FIGS. 10A and 10B show one of the various stages of manufacturing a semiconductor FET device according to embodiments of the present disclosure.
Figure 10A:
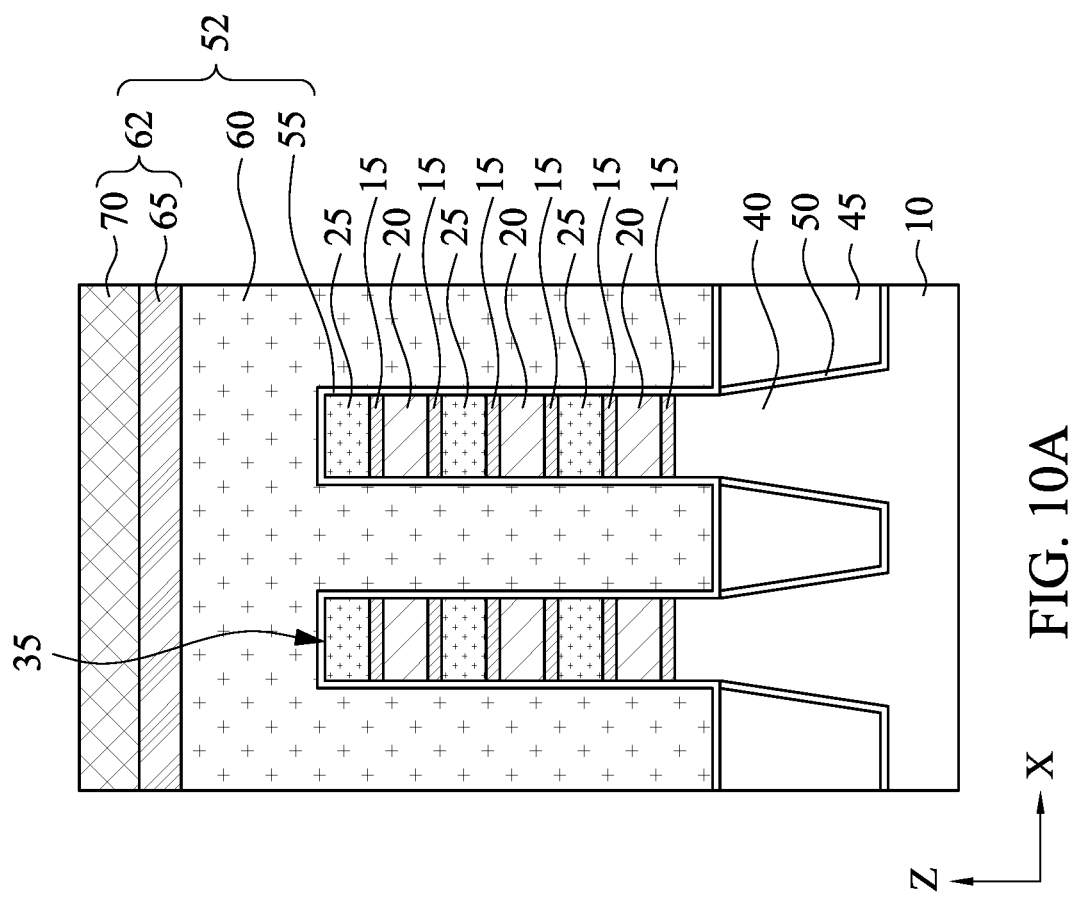

After the isolation insulating layer 45 is formed, a sacrificial (dummy) gate structure 52 is formed, as shown in FIGS. 10A and 10B. FIG. 10A is a cross sectional view taken along the gate electrode in the X-direction (line A-A). FIG. 10B is a cross sectional view taken along the fin structure in the Y-direction (line B-B). FIGS. 10A and 10B illustrate a structure after a sacrificial gate structure 52 is formed over the exposed fin structures 35. The sacrificial gate structure 52 is formed over a portion of the fin structures 35 which is to be a channel region. The sacrificial gate structure 52 defines the channel region of the GAA FET. The sacrificial gate structure 52 includes a sacrificial gate dielectric layer 55 and a sacrificial gate electrode layer 60. The sacrificial gate dielectric layer 55 includes one or more layers of insulating material, such as a silicon oxide-based material. In one embodiment, silicon oxide formed by CVD is used. The thickness of the sacrificial gate dielectric layer 55 is in a range from about 1 nm to about 5 nm in some embodiments.

The sacrificial gate structure 52 is formed by first blanket depositing the sacrificial gate dielectric layer over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer 62 is formed over the sacrificial gate electrode layer. The mask layer 62 includes a pad silicon nitride layer 65 and a silicon oxide mask layer 70.

Next, a patterning operation is performed on the mask layer 62 and sacrificial gate electrode layer 60 is patterned into the sacrificial gate structure 52, as shown in FIGS. 10A and 10B. The sacrificial gate structure 52 includes the sacrificial gate dielectric layer 55, the sacrificial gate electrode layer 60 (e.g., polysilicon), and the mask layer 62, including the silicon nitride pad layer 65 and the silicon oxide mask layer 65. By patterning the sacrificial gate structure, the stacked layers of the first, second, and third semiconductor layers are partially exposed on opposite sides of the sacrificial gate structure, thereby defining source/drain (S/D) regions. In this disclosure, a source and a drain are interchangeably used and the structures thereof are substantially the same. In FIGS. 10A and 10B, one sacrificial gate structure 52 is formed, but the number of the sacrificial gate structures is not limited to one. Two or more sacrificial gate structures are arranged in the Y direction of the fin structures in some embodiments. In certain embodiments, one or more dummy sacrificial gate structures are formed on both sides of the sacrificial gate structures to improve pattern fidelity.

Figure 11B:
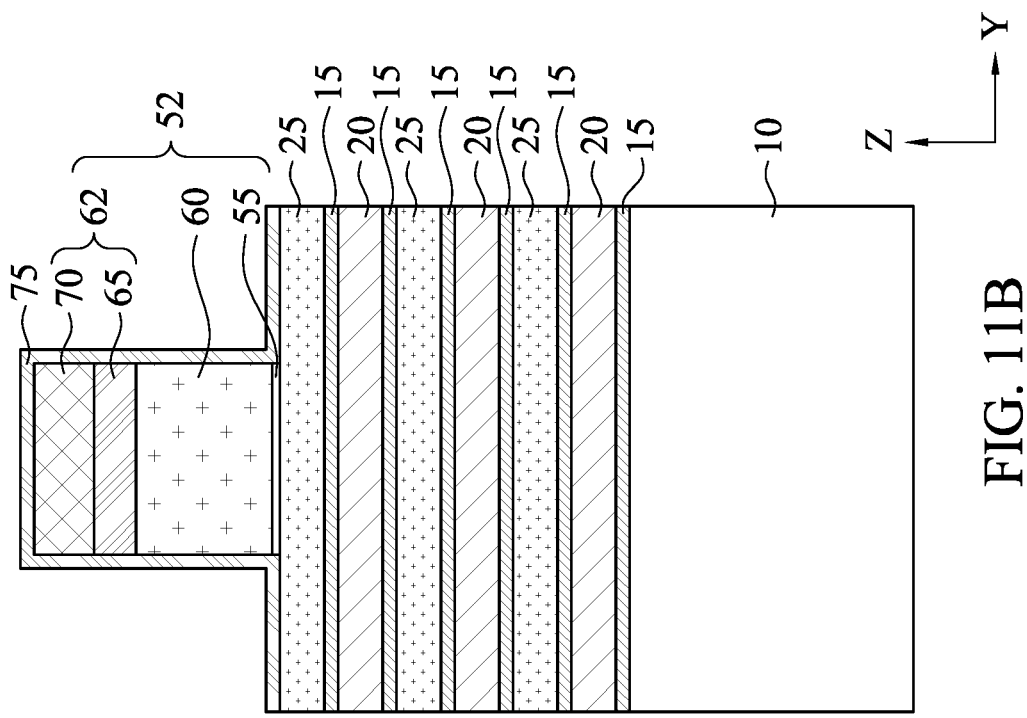
FIGS. 11A-11D show one of the various stages of manufacturing a semiconductor FET device according to embodiments of the present disclosure.
Figure 11A:
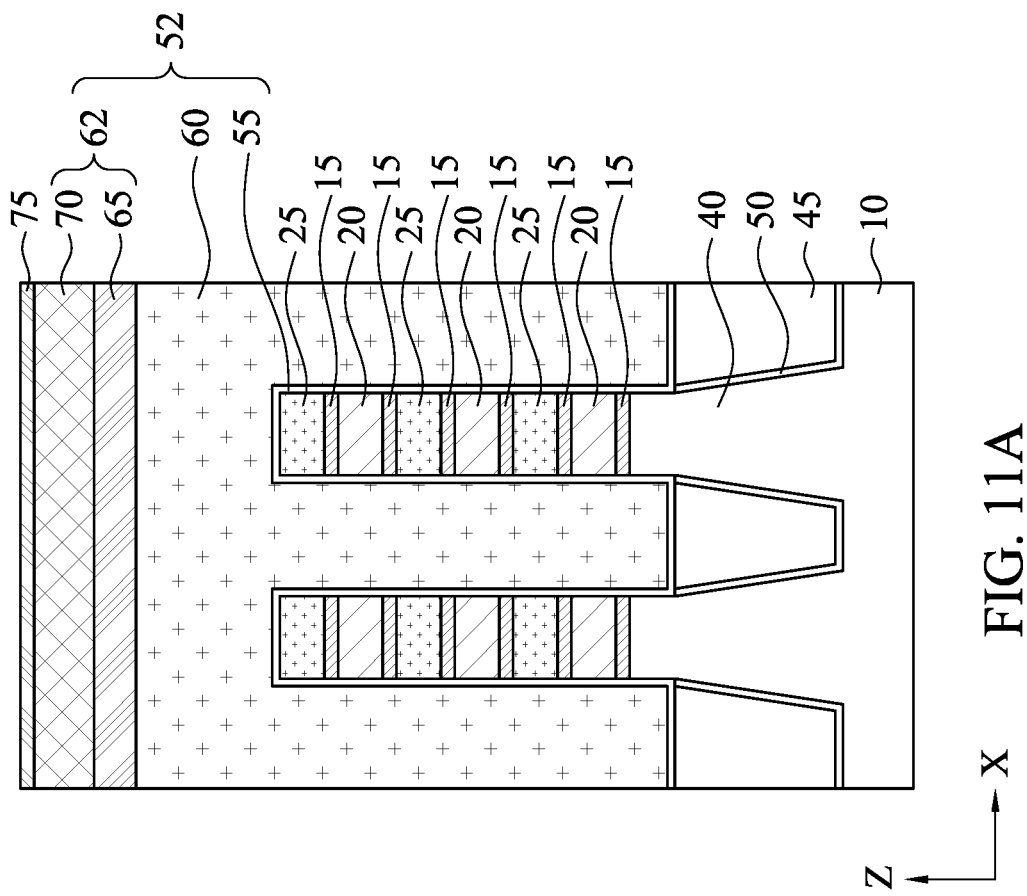
Figure 11D:
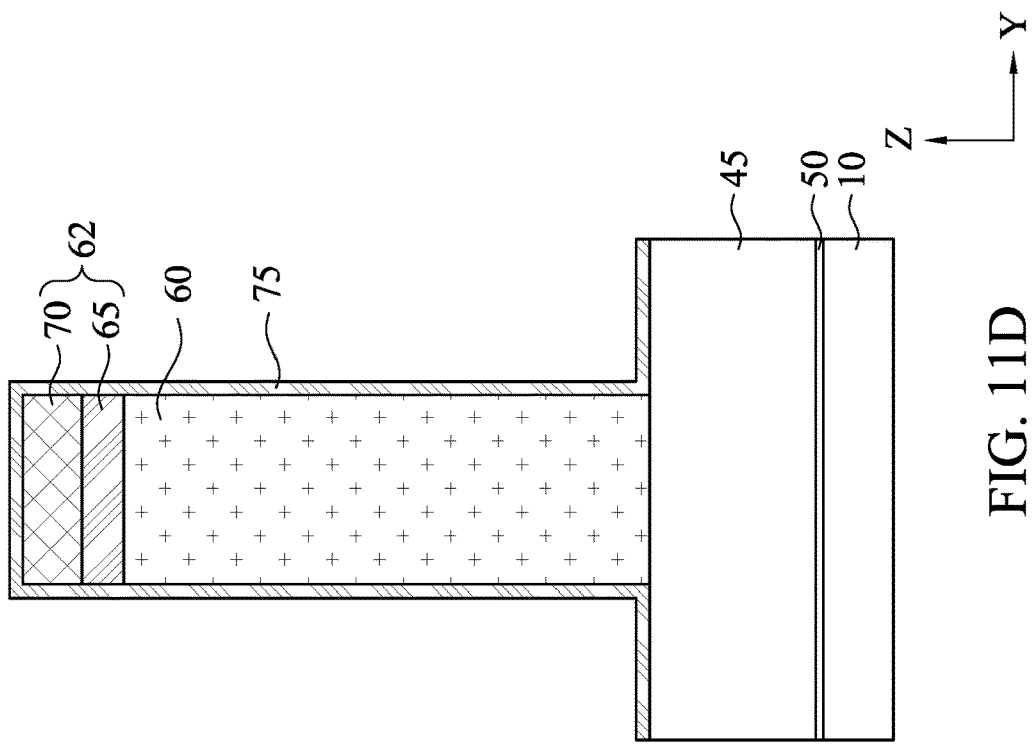
Figure 11C:
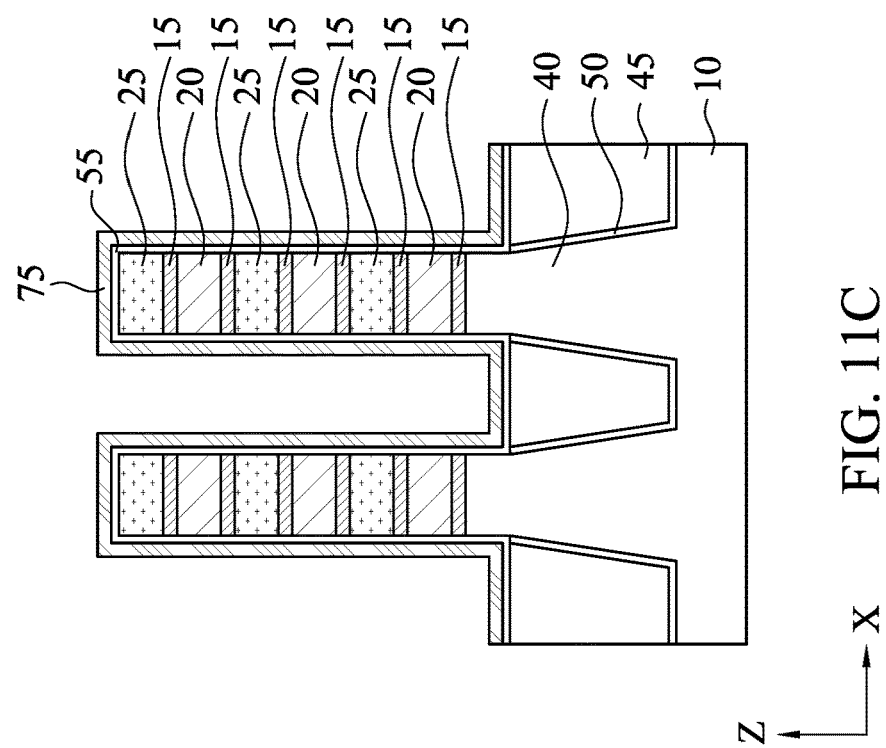

After the sacrificial gate structure 52 is formed, a cover layer 75 made of an insulating material is conformally formed over the exposed fin structures 35 and the sacrificial gate structure 52, as shown in FIGS. 11A-11D. FIG. 11A is a cross sectional view taken along the gate electrode in the X-direction (line A-A of FIG. 1). FIG. 11B is a cross sectional view taken along the fin structure in the Y-direction (line B-B of FIG. 1). FIG. 11C is a cross sectional view taken along line C-C of FIG. 1. FIG. 11D is a cross sectional view taken along line D-D of FIG. 1. The cover layer 75 is deposited in a conformal manner so it is formed to have substantially equal thicknesses on vertical surfaces, such as the sidewalls, horizontal surfaces, and the top of the sacrificial gate structure, respectively. In some embodiments, the cover layer 75 has a thickness in a range from about 2 nm to about 20 nm, in other embodiments, the cover layer 75 has a thickness in a range from about 5 nm to about 15 nm.

In some embodiments, the cover layer 75 includes a first cover layer and a second cover layer. The first cover layer may include a low-k dielectric material, such as SiOC and/or SiOCN or any other suitable dielectric material, and the second cover layer 53 may include one or more of $Si_3N_4$, SiON, and SiCN or any other suitable dielectric material.

The first cover layer and the second cover layer are made of different materials in some embodiments so they can be selectively etched. The first cover layer and the second cover layer can be formed by ALD or CVD, or any other suitable method.

Figure 12B:
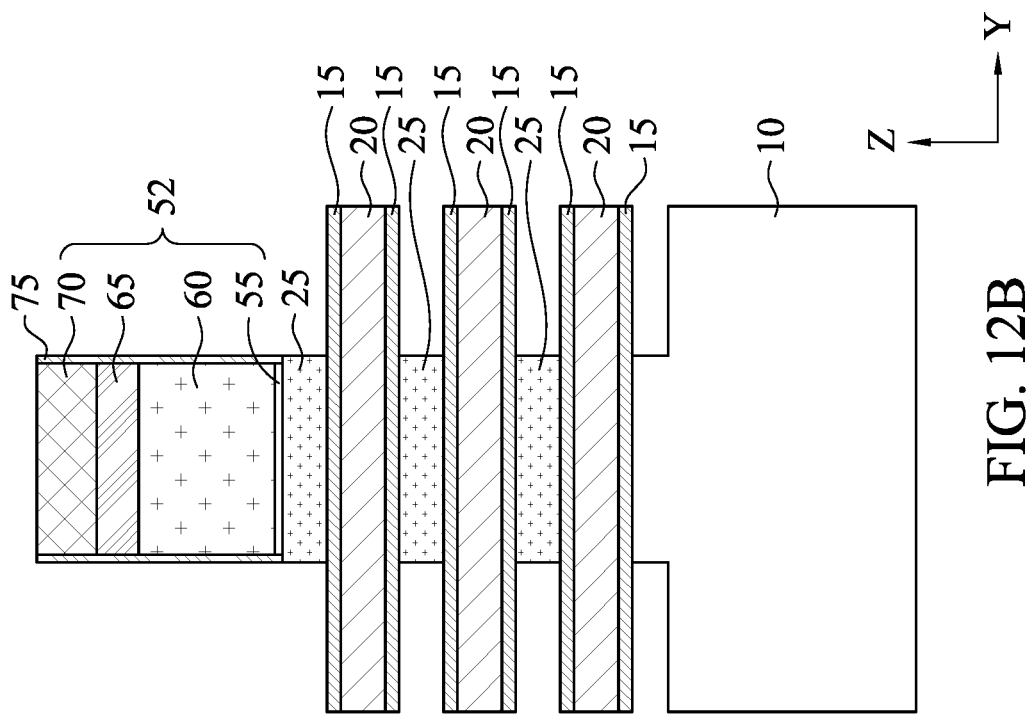
FIGS. 12A-12D show one of the various stages of manufacturing a semiconductor FET device according to embodiments of the present disclosure.
Figure 12A:
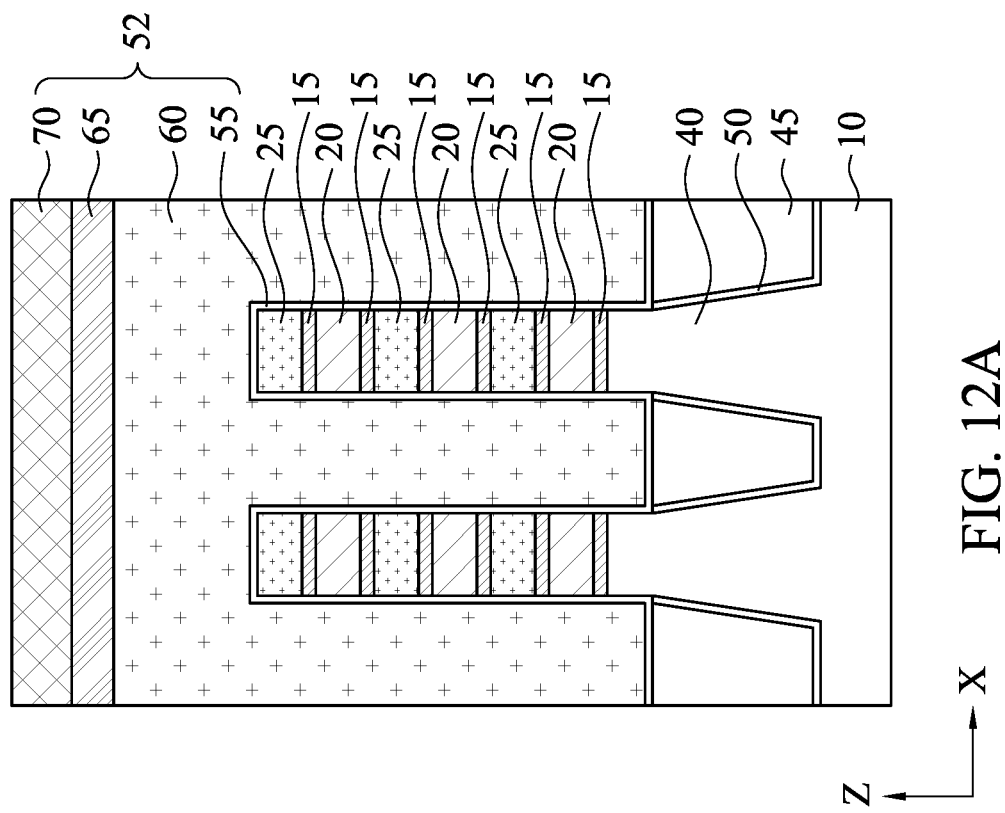
Figure 12D:
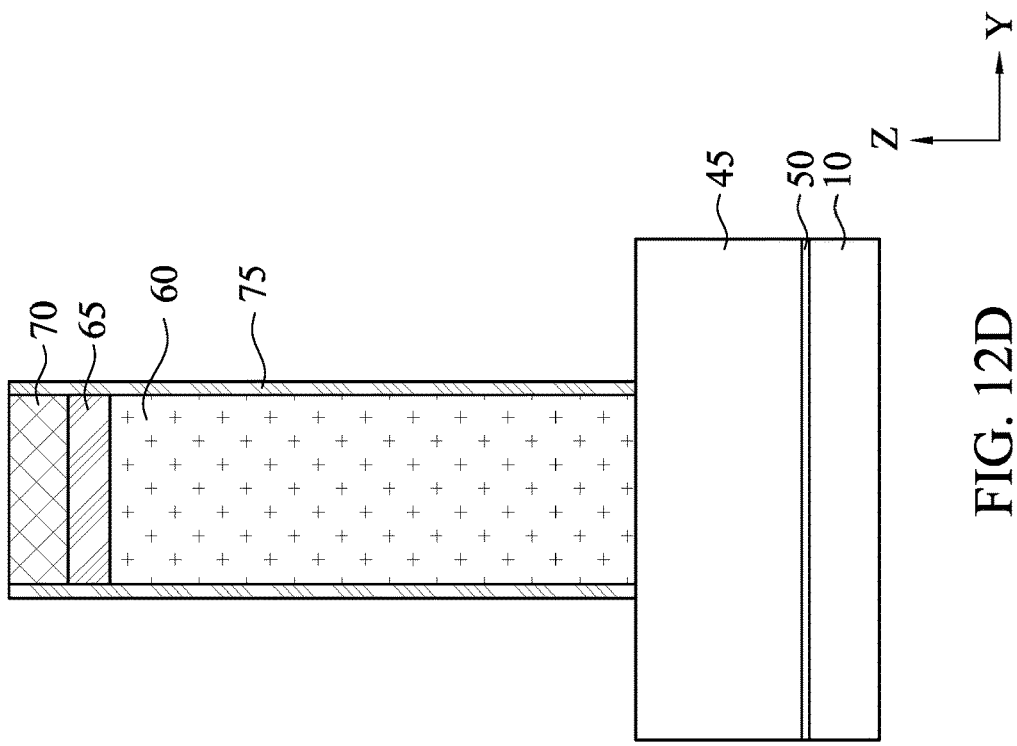
Figure 12C:
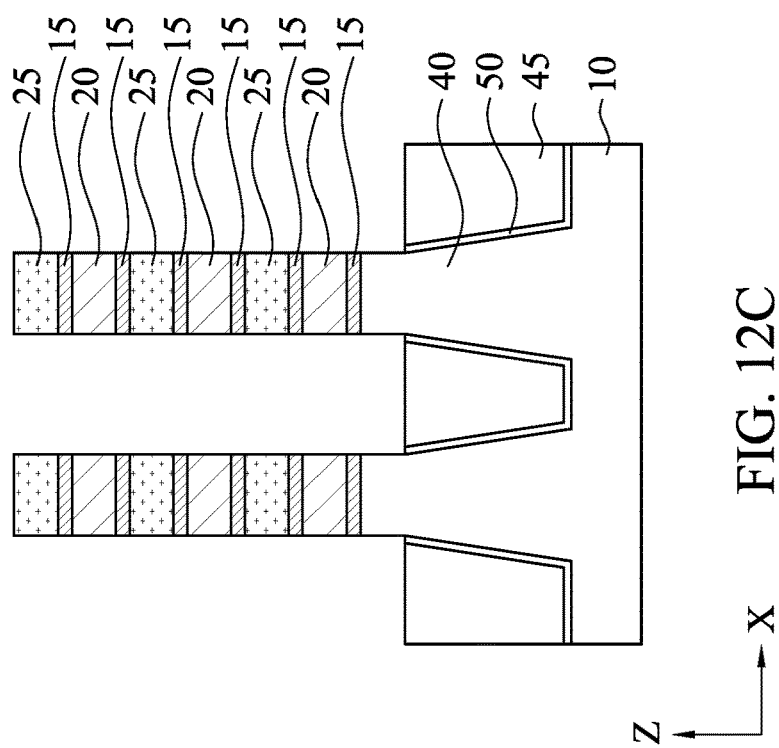

Then, as shown in FIGS. 12A-12D, the cover layer 75 is subjected to anisotropic etching to remove the cover layer 75 formed over the silicon oxide mask layer 70 and the source/drain regions, and then the third semiconductor layers 25 and upper portion of the substrate 10 in the source/drain regions are removed down to about the upper surface of the isolation insulating layer 45 in some embodiments. FIG. 12A is a cross sectional view taken along the gate electrode in the X-direction (line A-A of FIG. 1). FIG. 12B is a cross sectional view taken along the fin structure in the Y-direction (line B-B of FIG. 1). FIG. 12C is a cross sectional view taken along line C-C of FIG. 1. FIG. 12D is a cross sectional view taken along line D-D of FIG. 1. The third semiconductor layers 25 and upper portion of the substrate are removed using a suitable etching operation. For example, when the third semiconductor layers 25 are Si and the first and second semiconductor layers 15, 20 are Ge or SiGe, the third semiconductor layers 25 can be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. In some embodiments, the third semiconductor layers 25 are removed when forming a p-type pFET.

As shown in FIG. 12C, the cover layer 75 and sacrificial gate dielectric layer 55 are completely removed in the source/drain regions using suitable lithography and etching techniques.

Figure 12E:
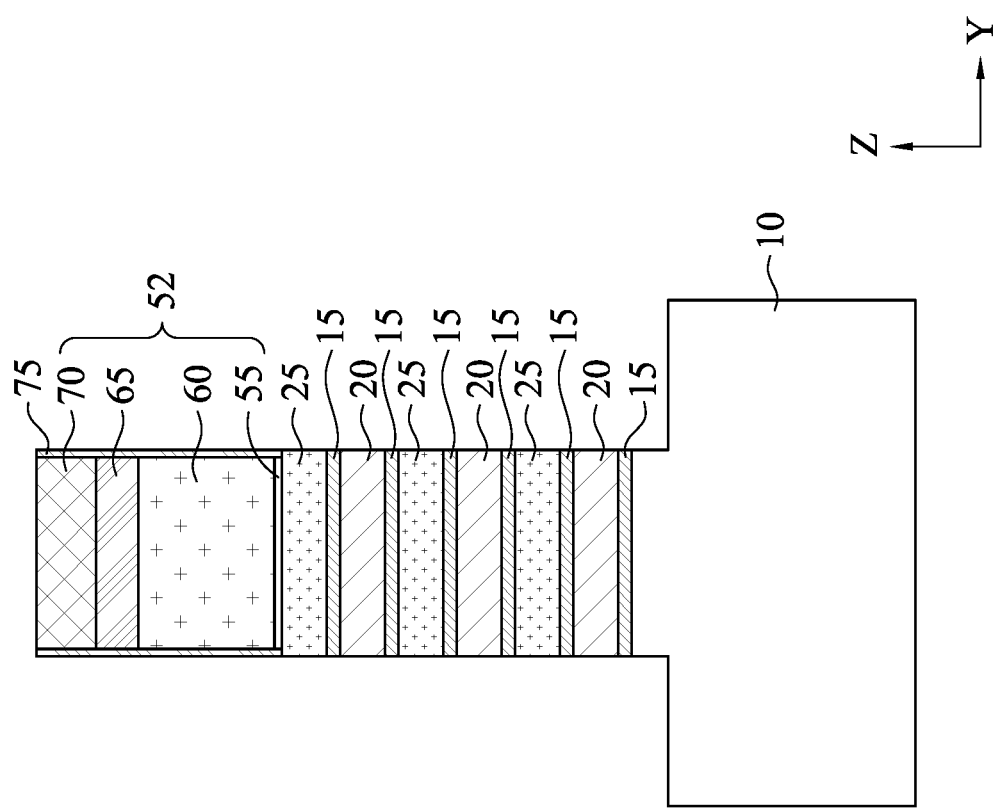
FIG. 12E is a cross sectional view taken along line B-B of FIG. 1 of another embodiment.

In other embodiments, the fin structures in the source/drain regions are recessed down to about the upper surface of the isolation insulating layer 45, as shown in FIG. 12E. In other words, all the first, second and third semiconductor layers and the upper portion of the substrate 10 are removed in the source/drain regions. FIG. 12E is a cross sectional view taken along line B-B of FIG. 1. The fin structures are recessed by a recess etching operation using suitable etchants in some embodiments. In some embodiments, the recess etching operation is a dry etching operation. In some embodiments, the fin structures are recessed in the source/drain regions when forming an n-type pFET.

Figure 13B:
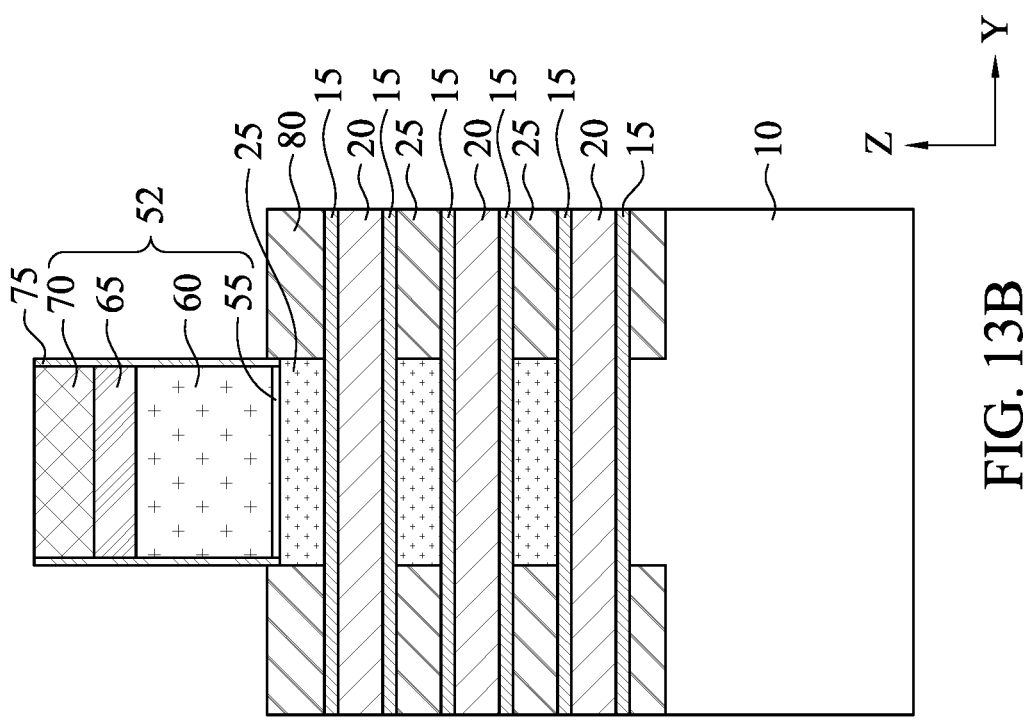
FIGS. 13A-13D show one of the various stages of manufacturing a semiconductor FET device according to embodiments of the present disclosure.
Figure 13A:
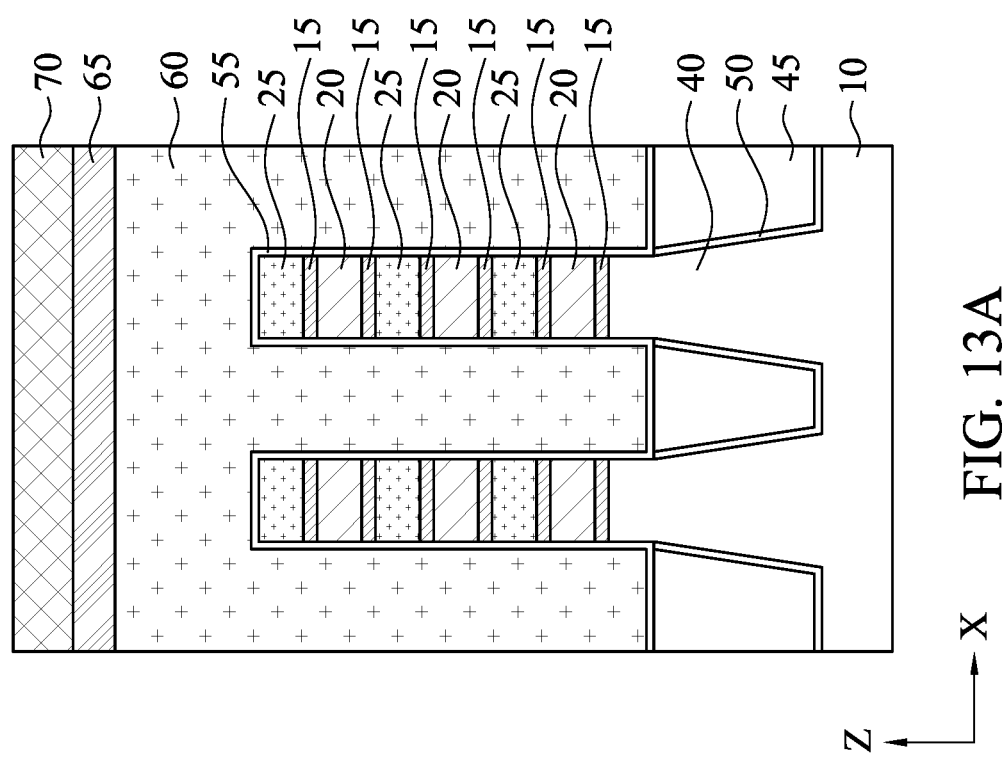
Figure 13D:
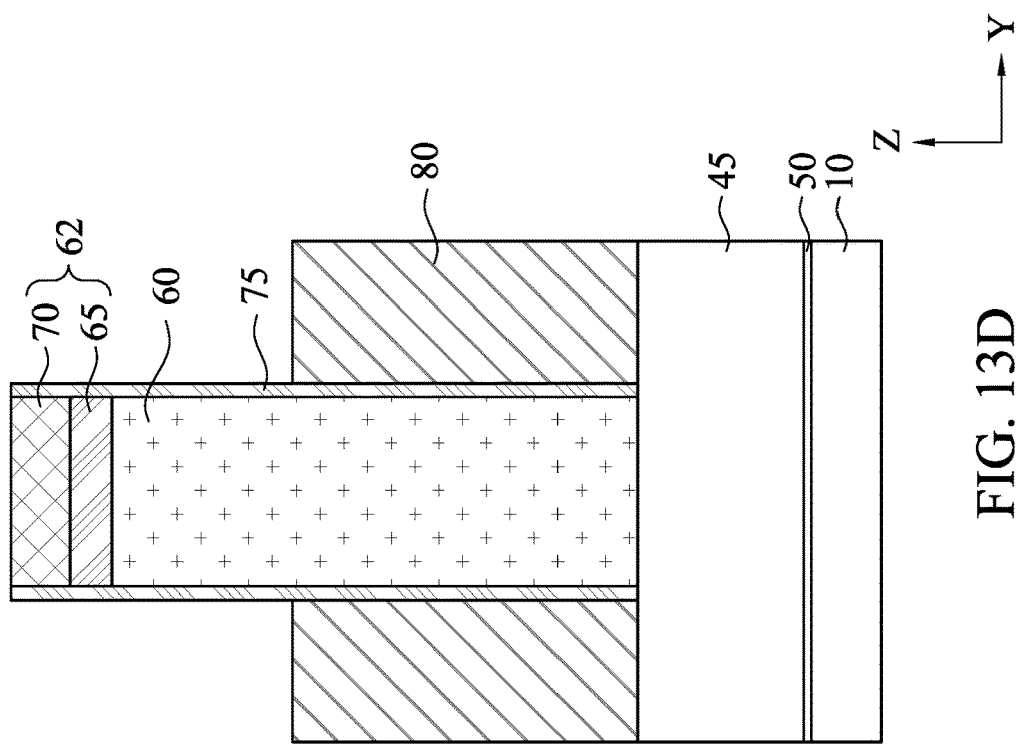
Figure 13C:
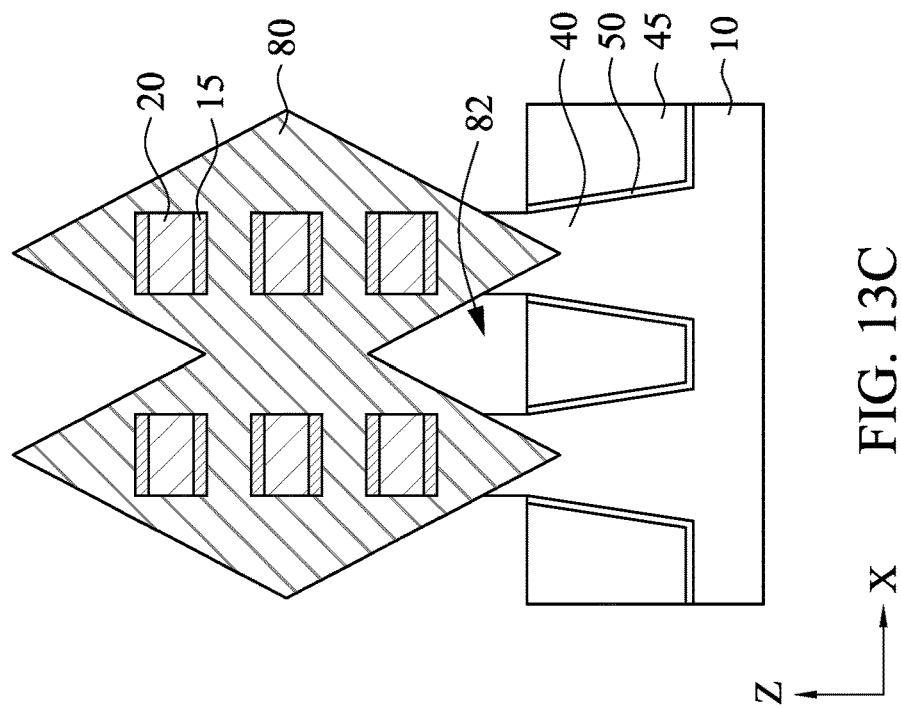

Subsequently, a source/drain epitaxial layer 80 is formed, as shown in FIGS. 13A-13D. FIG. 13A is a cross sectional view taken along the gate electrode in the X-direction (line A-A of FIG. 1). FIG. 13B is a cross sectional view taken along the fin structure in the Y-direction (line B-B of FIG. 1). FIG. 13C is a cross sectional view taken along line C-C of FIG. 1. FIG. 13D is a cross sectional view taken along line D-D of FIG. 1.

The source/drain epitaxial layer 80 includes one or more layers of Si, SiP, SiC and SiCP for an n-channel FET or Si, SiGe, Ge for a p-channel FET. For the P-channel FET, boron (B) may also be contained in the source/drain. The source/drain epitaxial layers 80 are formed by an epitaxial growth method using CVD, ALD or molecular beam epitaxy (MBE). As shown in FIG. 13C, the source/drain epitaxial layers 80 grow around the fin structures, and the grown epitaxial layers merge above the isolation insulating layer 45 and subsequently define a void 82 in some embodiments. The source/drain epitaxial layer 80 is formed in contact with the cover layer 75 disposed over side faces of the sacrificial gate structure 52, as shown in FIG. 13D.

In some embodiments, the source/drain epitaxial layer 80 has a diamond shape, a hexagonal shape, other polygonal shapes, or a semi-circular shape in cross section.

Figure 13F:
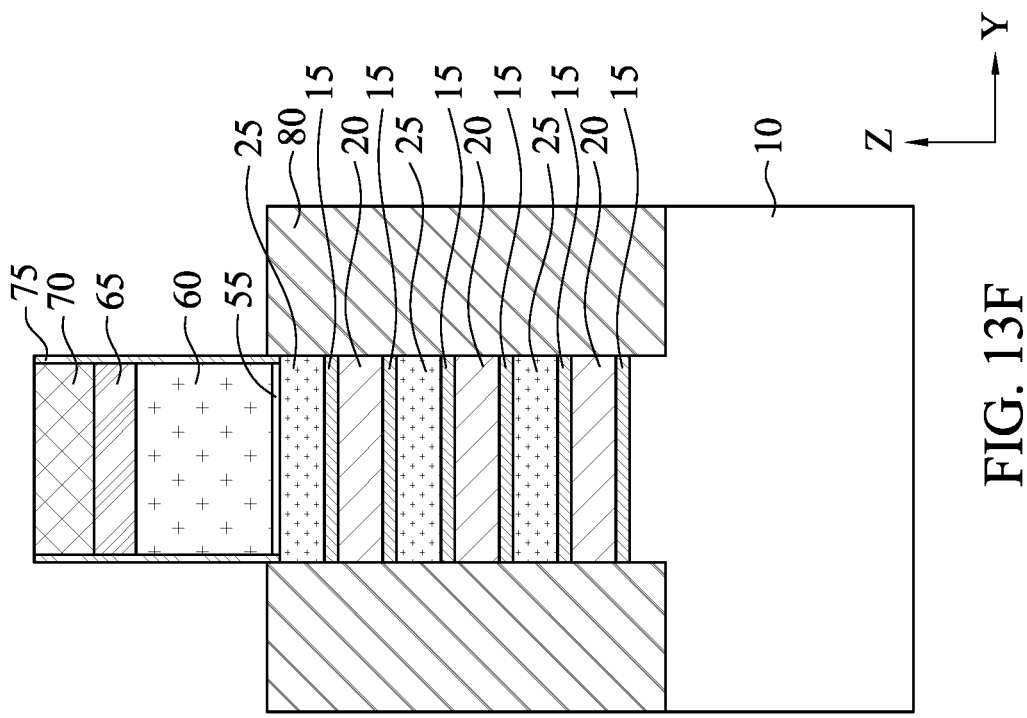
FIG. 13F is a cross sectional view taken along line B-B of FIG. 1 of an another embodiment.
Figure 13E:
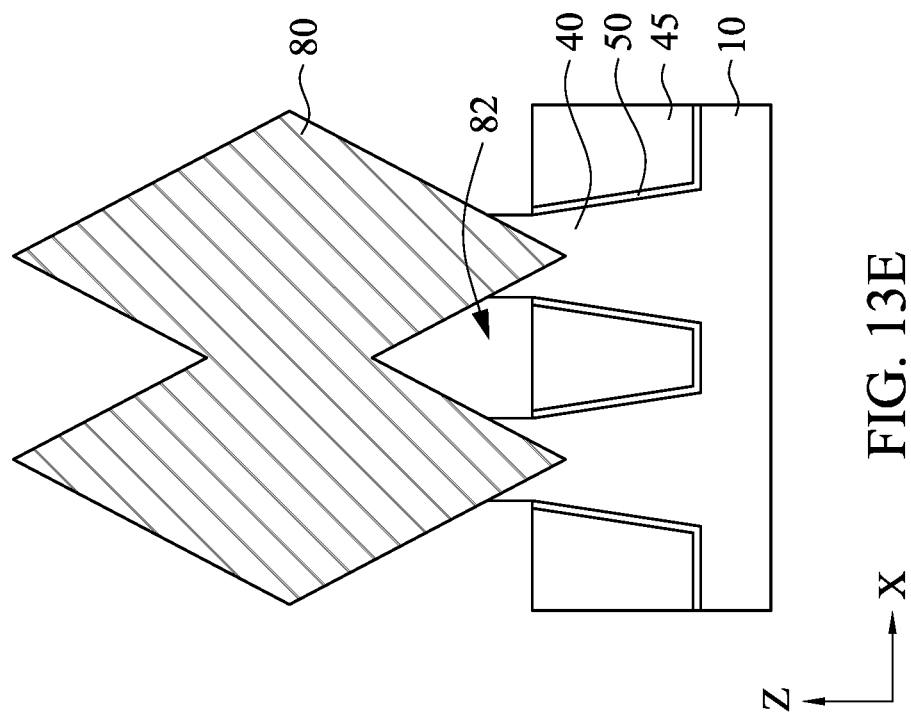
FIG. 13E is a cross sectional view taken along line C-C of FIG. 1

FIGS. 13E and 13F show another embodiment, where the source/drain epitaxial layer 80 is formed on the structure of FIG. 12E. FIG. 13E is a cross sectional view taken along line C-C of FIG. 1 and FIG. 13F is a cross sectional view taken along line B-B of FIG. 1.

Figure 14B:
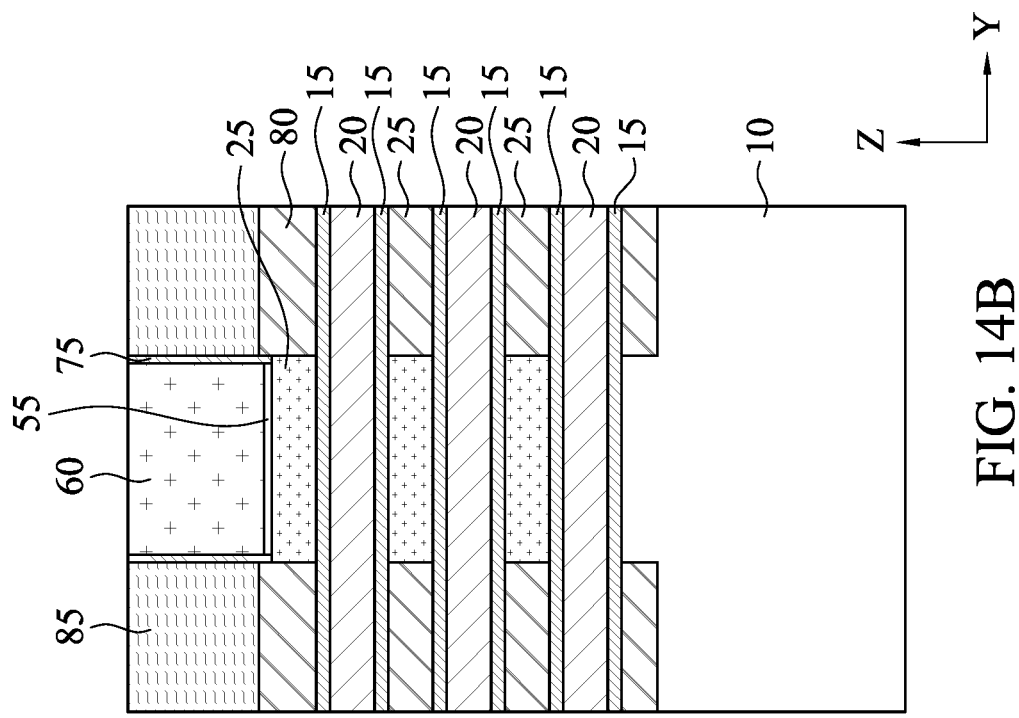
FIGS. 14A-14D show one of the various stages of manufacturing a semiconductor FET device according to embodiments of the present disclosure.
Figure 14A:
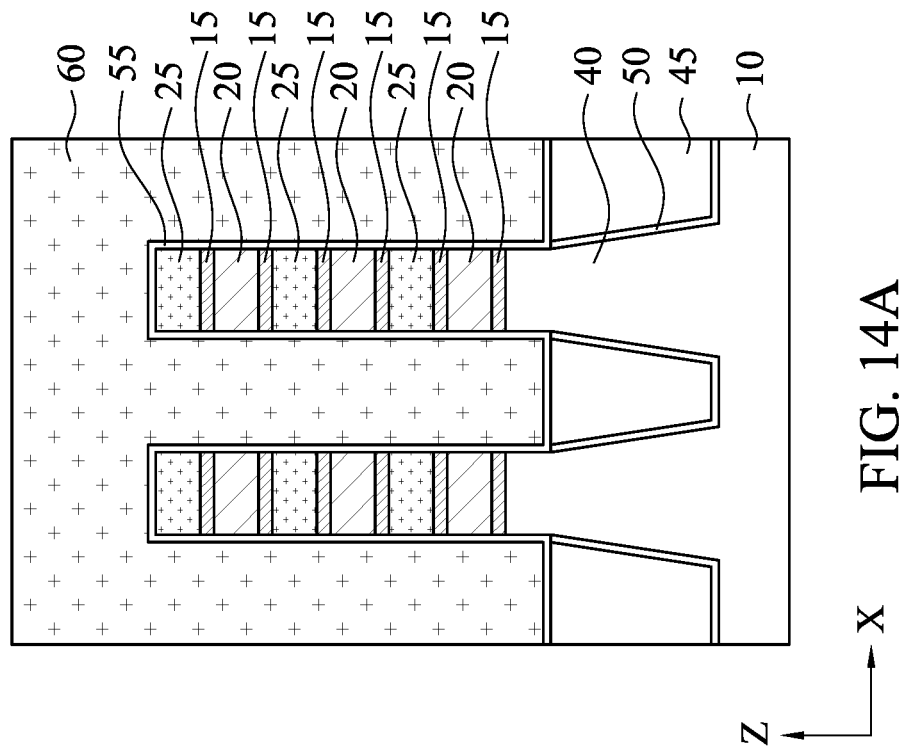
Figure 14D:
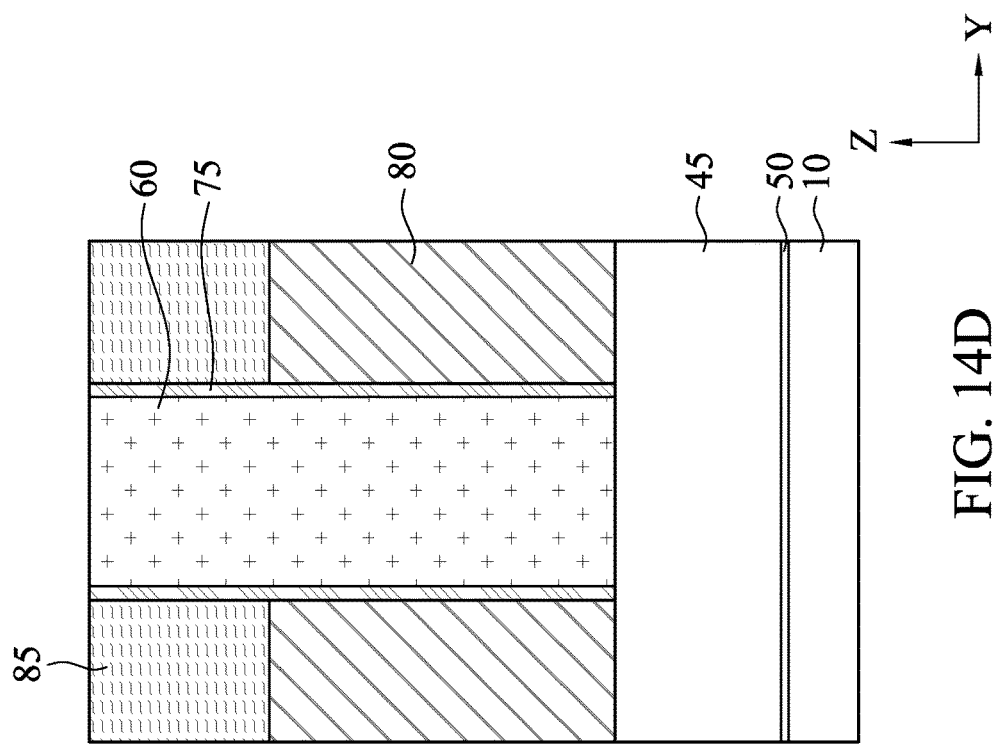
Figure 14C:
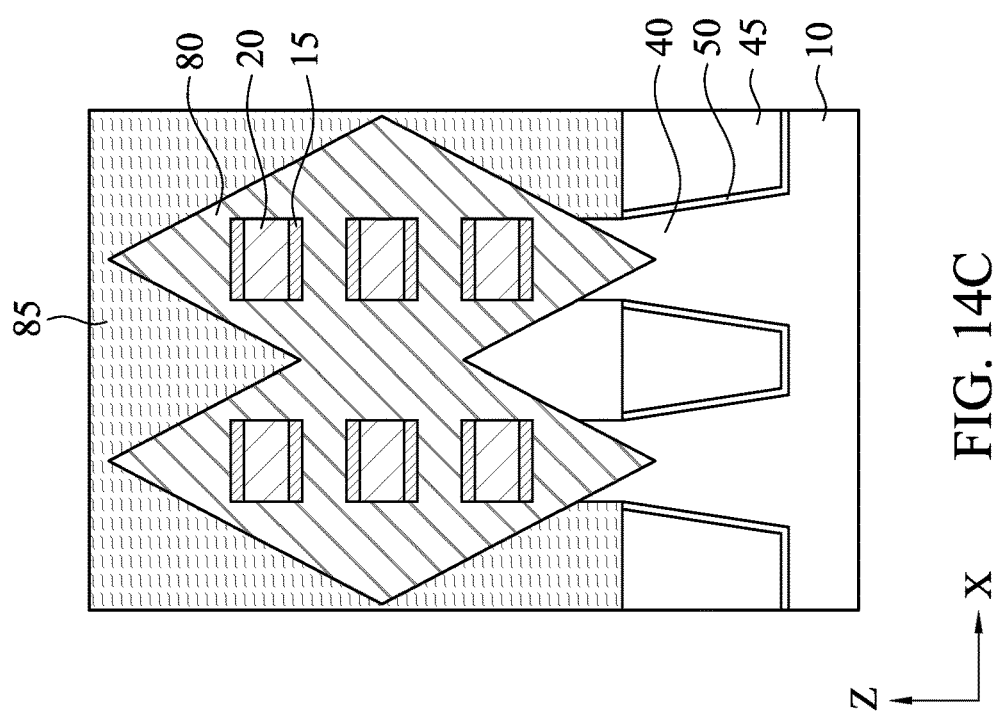

Subsequently, an interlayer dielectric (ILD) layer 85 is formed, as shown in FIGS. 14A-14D. FIG. 14A is a cross sectional view taken along the gate electrode in the X-direction (line A-A of FIG. 1). FIG. 14B is a cross sectional view taken along the fin structure in the Y-direction (line B-B of FIG. 1). FIG. 14C is a cross sectional view taken along line C-C of FIG. 1. FIG. 14D is a cross sectional view taken along line D-D of FIG. 1.

The materials for the ILD layer 85 include compounds comprising Si, O, C, and/or H, such as silicon oxide, SiCOH and SiOC. Organic materials, such as polymers, may be used for the ILD layer 85. After the ILD layer 85 is formed, a planarization operation, such as chemical-mechanical polishing (CMP), is performed, so that the top portion of the sacrificial gate electrode layer 60 is exposed. The CMP also removes a portion of the cover layer 75, and the mask layer 62 covering the upper surface of the sacrificial gate electrode layer 60.

Figure 14F:
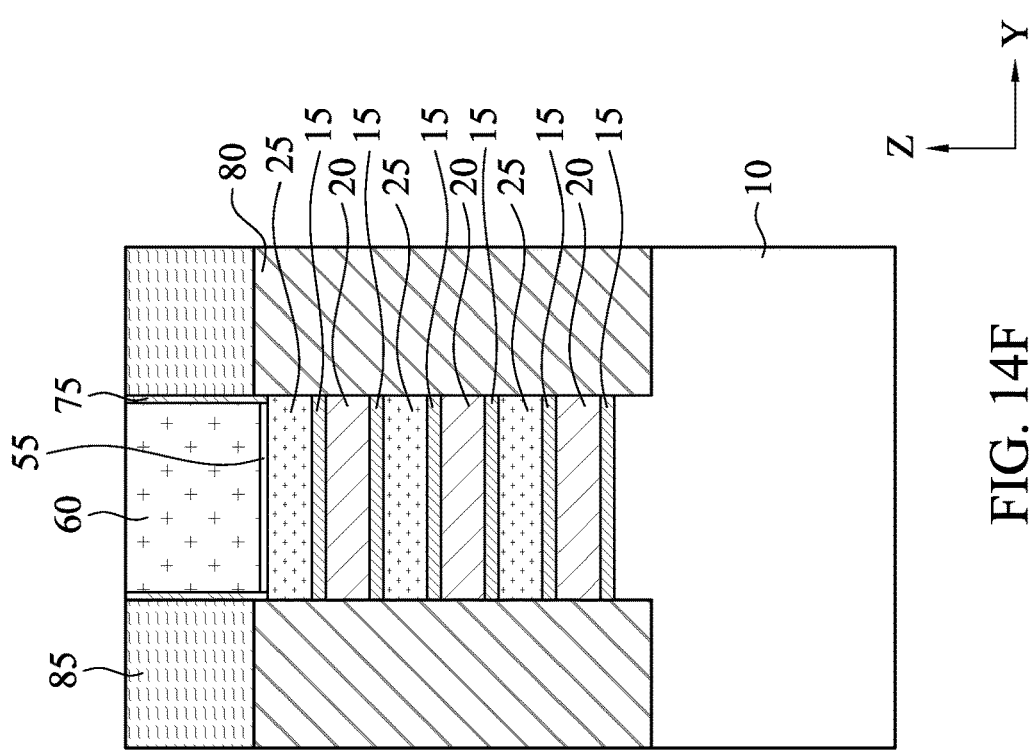
FIG. 14F is a cross sectional view taken along line B-B of FIG. 1 of an another embodiment.
Figure 14E:
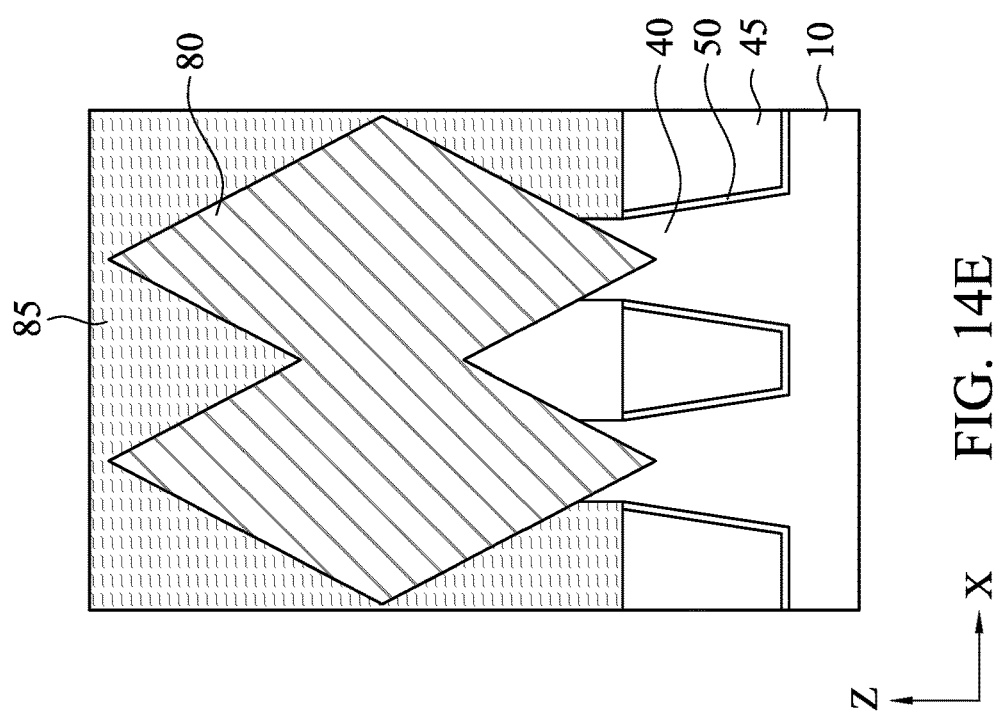
FIG. 14E is a cross sectional view taken along line C-C of FIG. 1

FIGS. 14E and 14F show another embodiment, where the ILD layer 85 is formed on the structure of FIGS. 13E and 13F. FIG. 14E is a cross sectional view taken along line C-C of FIG. 1 and FIG. 14F is a cross sectional view taken along line B-B of FIG. 1.

Figure 15B:
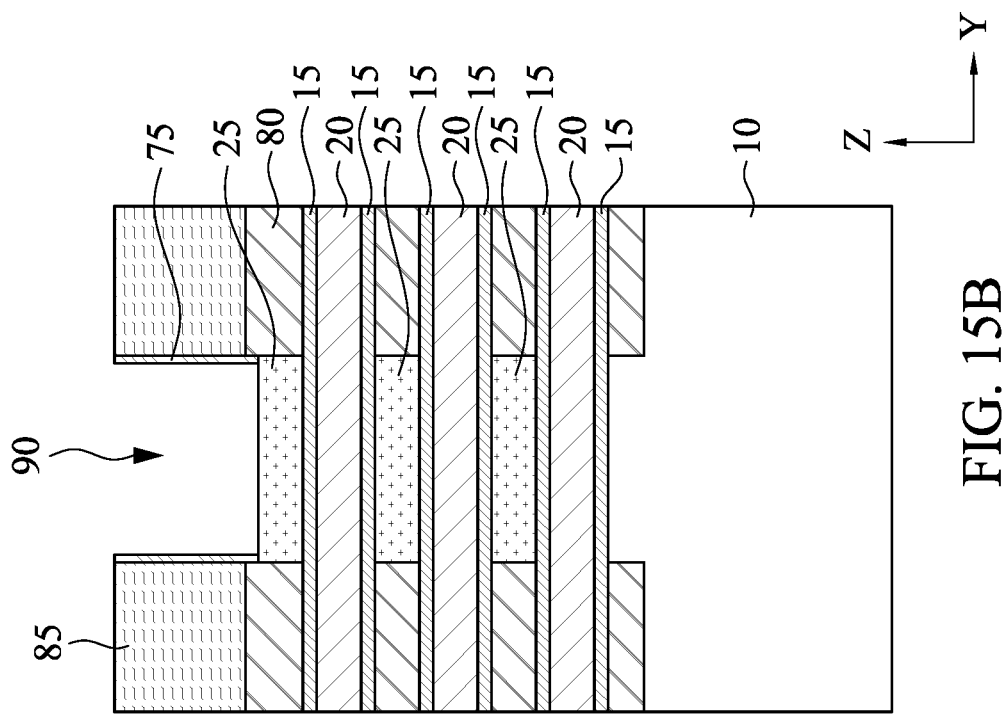
FIGS. 15A-15D show one of the various stages of manufacturing a semiconductor FET device according to embodiments of the present disclosure.
Figure 15A:
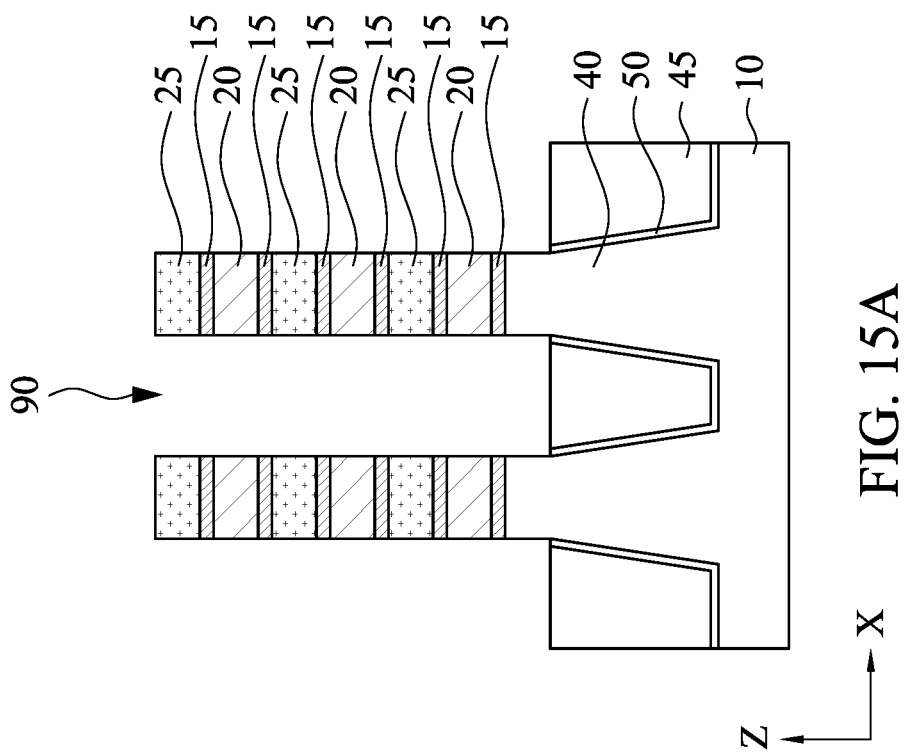
Figure 15D:
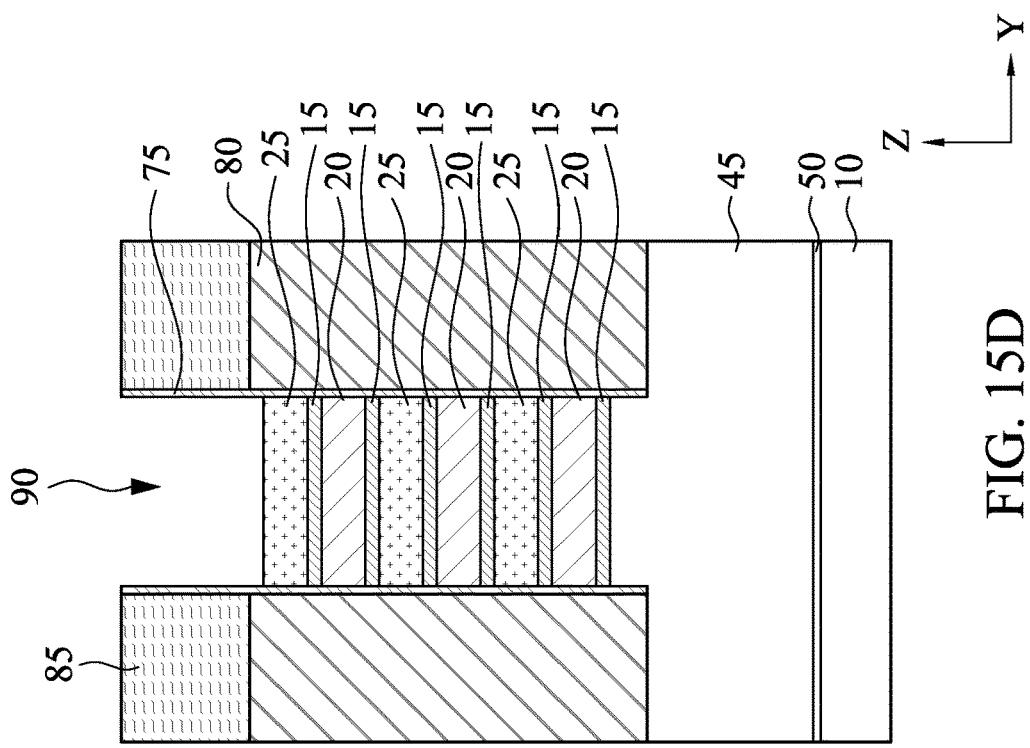
Figure 15C:
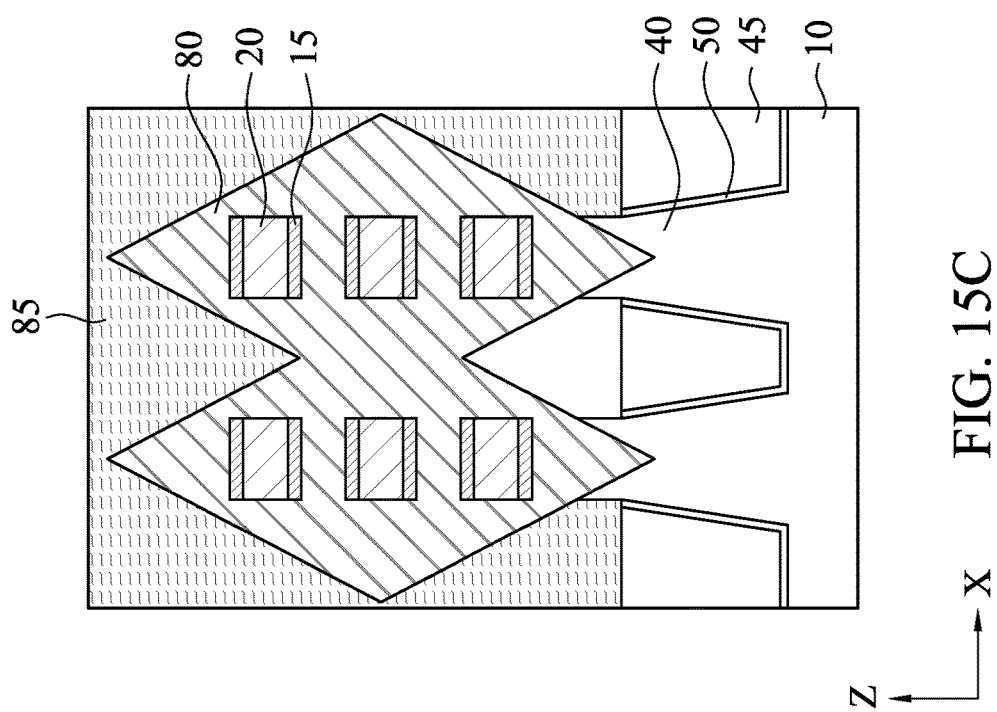

Then, the sacrificial gate electrode layer 60 and sacrificial gate dielectric layer 55 are removed, thereby forming a gate space 90, in which the channel regions of the fin structures are exposed, as shown in FIGS. 15A-15D. FIG. 15A is a cross sectional view taken along the gate electrode in the X-direction (line A-A of FIG. 1). FIG. 15B is a cross sectional view taken along the fin structure in the Y-direction (line B-B of FIG. 1). FIG. 15C is a cross sectional view taken along line C-C of FIG. 1. FIG. 15D is a cross sectional view taken along line D-D of FIG. 1.

The ILD layer 85 protects the S/D structures 80 during the removal of the sacrificial gate structures. The sacrificial gate structures can be removed using plasma dry etching and/or wet etching. When the sacrificial gate electrode layer 60 is polysilicon and the ILD layer 85 is silicon oxide, a wet etchant such as a tetramethylammonium hydroxide (TMAH) solution can be used to selectively remove the sacrificial gate electrode layer 60. The sacrificial gate dielectric layer 55 is thereafter removed using plasma dry etching and/or wet etching.

Figure 15F:
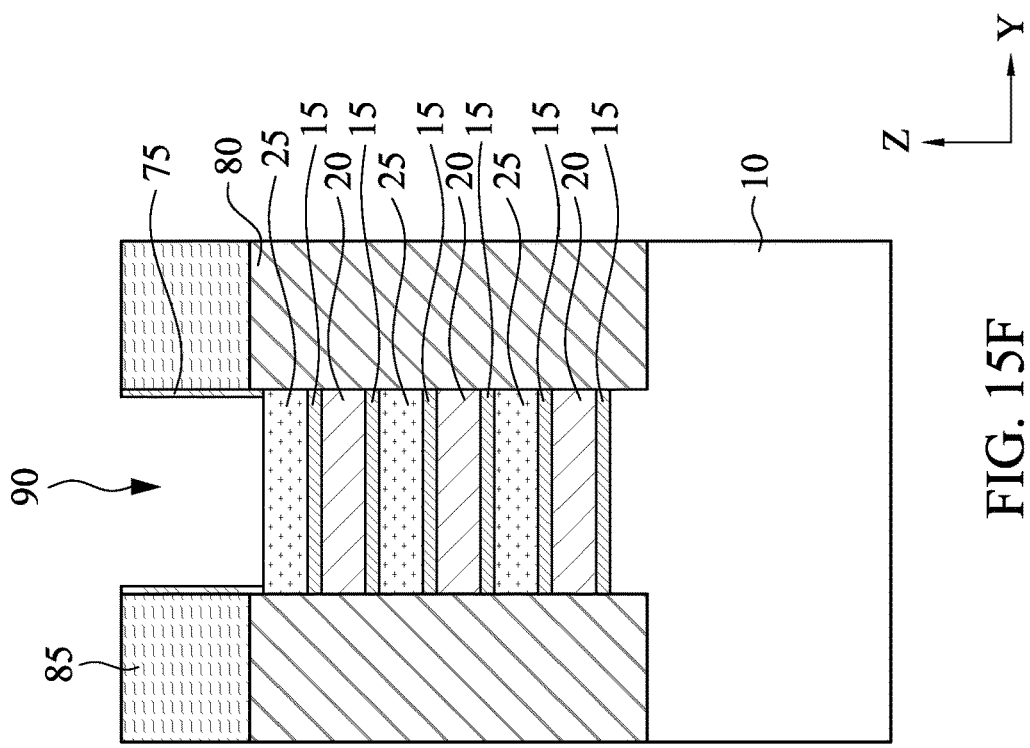
FIG. 15F is a cross sectional view taken along line B-B of FIG. 1 of an another embodiment.
Figure 15E:
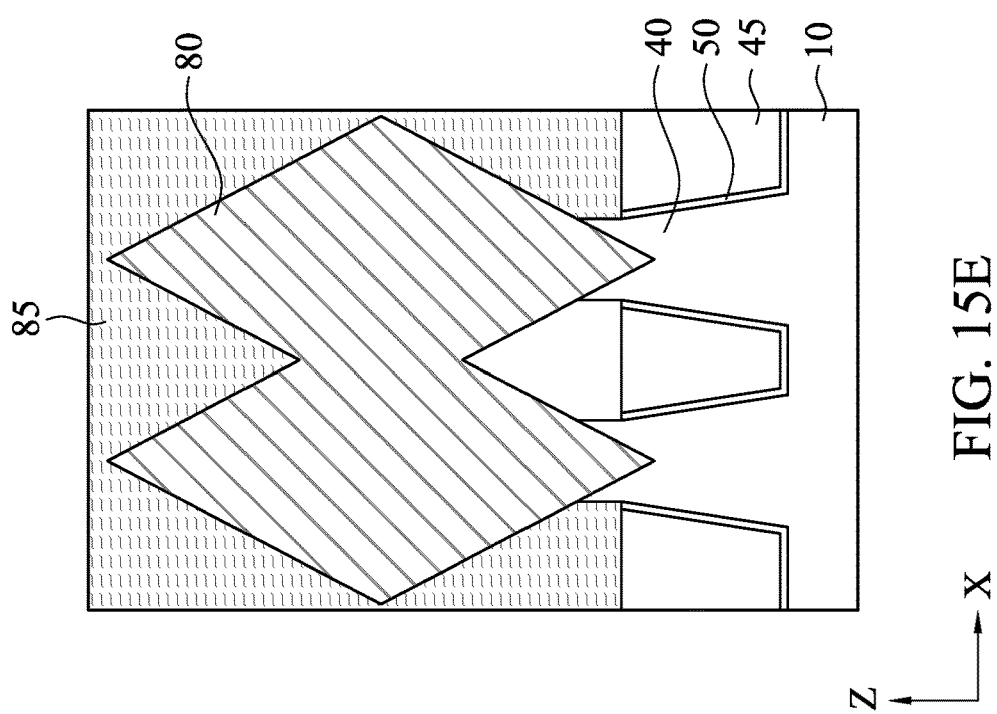
FIG. 15E is a cross sectional view taken along line C-C of FIG. 1

FIG. 15E is a cross sectional view taken along line C-C of FIG. 1 and FIG. 15F is a cross sectional view taken along line B-B of FIG. 1 of another embodiment where the sacrificial gate electrode layer 60 and sacrificial gate dielectric layer of FIG. 14F are removed.

Figure 15G:
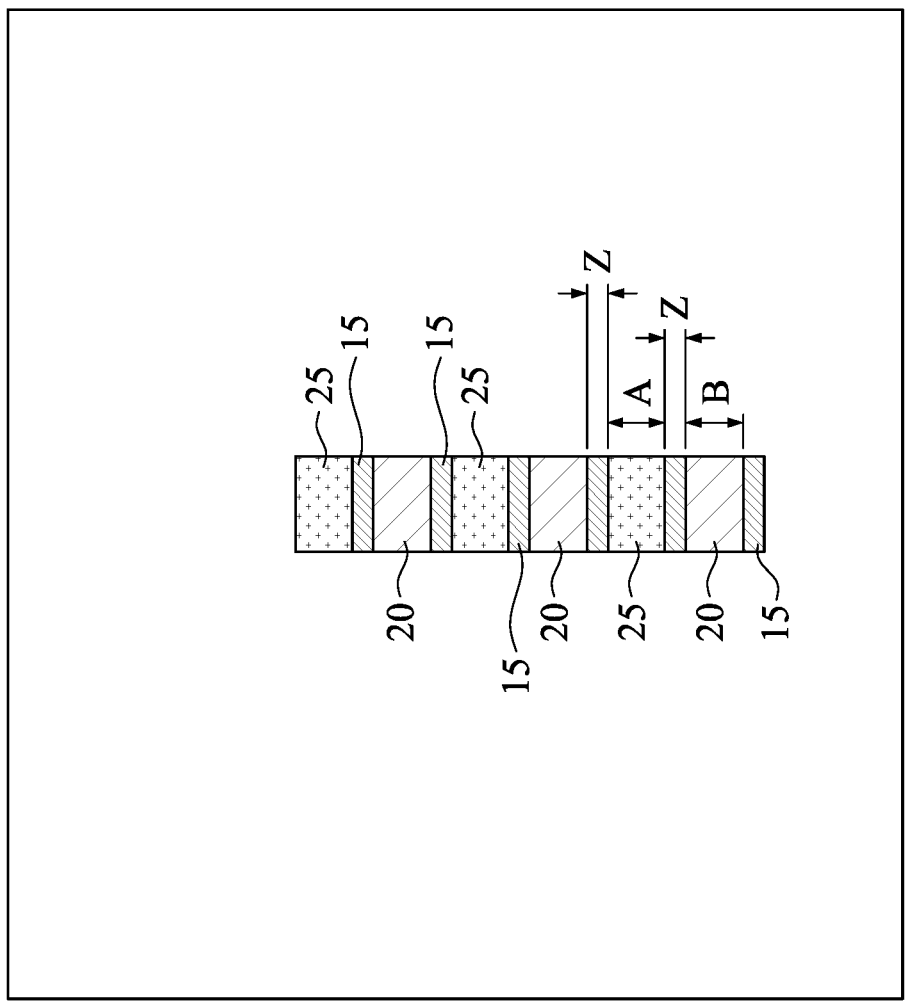
FIG. 15G is a cross sectional detailed view of a fin structure in FIG. 15A.

FIG. 15G is a detailed view of a cross section of the fin structure according to an embodiment of the disclosure. As shown in FIG. 15G in one embodiment, the first semiconductor layer 15 is made of $Si_{0.5}Ge_{0.5}$ having a thickness Z of about 0.5 nm to about 5 nm. The second semiconductor layer 20 is made of $Si_{0.7}Ge_{0.3}$ having a thickness B of about 3 nm to about 20 nm. The third semiconductor layer 25 is made of Si having a thickness A of about 2 nm to about 18 nm. The thicknesses A, B, and Z are related by B>A>Z.

Figure 16B:
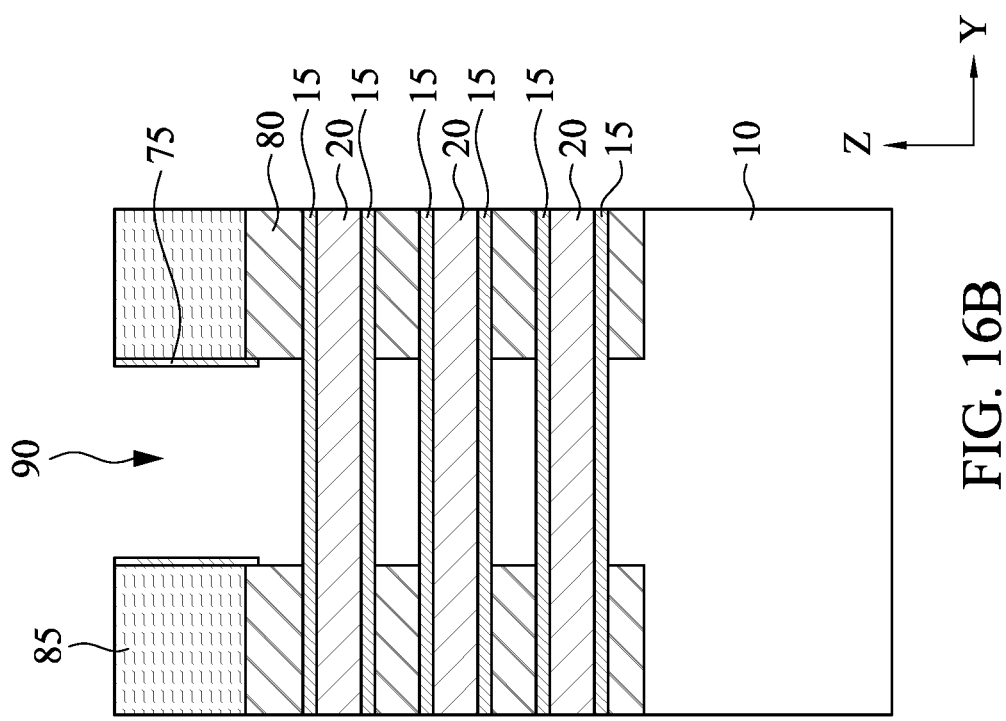
Figure 16A:
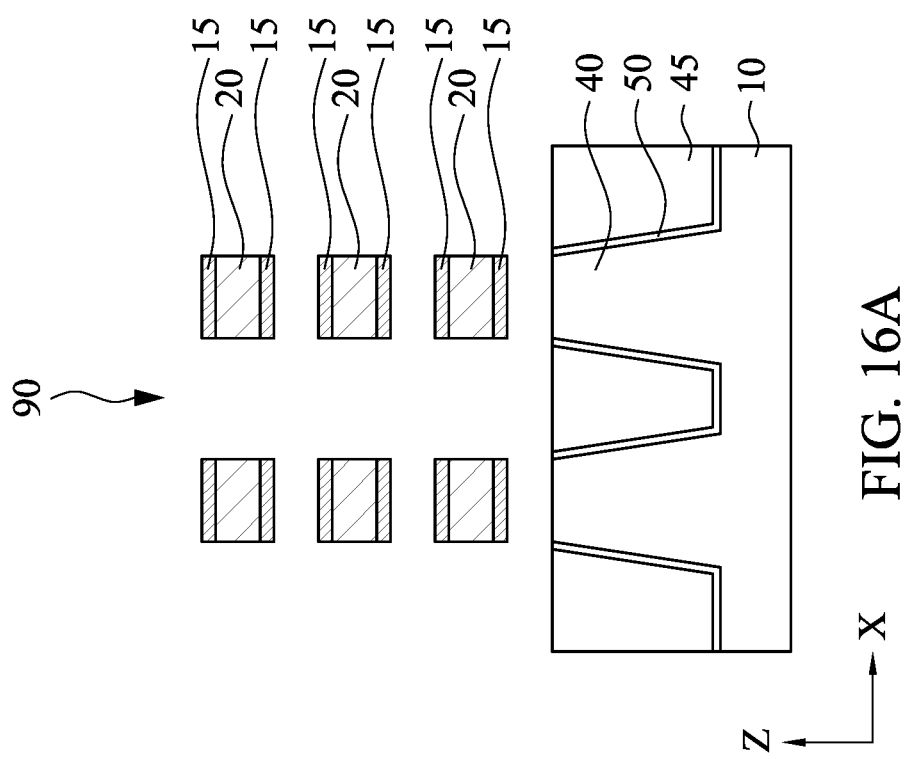

After the sacrificial gate structure is removed, the third semiconductor layers 25 in the fin structures are removed, thereby forming nanowires including the pair of first semiconductor layers 15 sandwiching the second semiconductor layers 20, as shown in FIGS. 16A-16D. FIG. 16A is a cross sectional view taken along the gate electrode in the X-direction (line A-A of FIG. 1). FIG. 16B is a cross sectional view taken along the fin structure in the Y-direction (line B-B of FIG. 1). FIG. 16C is a cross sectional view taken along line C-C of FIG. 1. FIG. 16D is a cross sectional view taken along line D-D of FIG. 1.

The third semiconductor layers 25 can be removed or etched using an etchant that selectively etches the first semiconductor layers 25 against the first and second semiconductor layers 15, 20. When the third semiconductor layers 25 are Si and the first and second semiconductor layers 15, 20 are Ge or SiGe, the third semiconductor layers 25 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. When the third semiconductor layers 25 are Si and the substrate 10 is a silicon substrate, the etching of the third semiconductor layers 25 also removes a portion of the fin structure underlying the bottommost first semiconductor layer 15. When the third semiconductor layers 25 and the substrate 10 are made of different materials an additional etching operation is performed in some embodiments to remove a portion of the fin structure underlying the bottommost first semiconductor layer 25, to provide the structure shown in FIGS. 16A and 16B. In other embodiments, where the third semiconductor layers 25 and the substrate 10 are made of different materials an initial third semiconductor layer 25 is formed on the substrate 10, as shown in FIG. 6C, which is removed with the other third semiconductor layers 25 to provide the structure shown in FIGS. 16A and 16B.

Figure 16F:
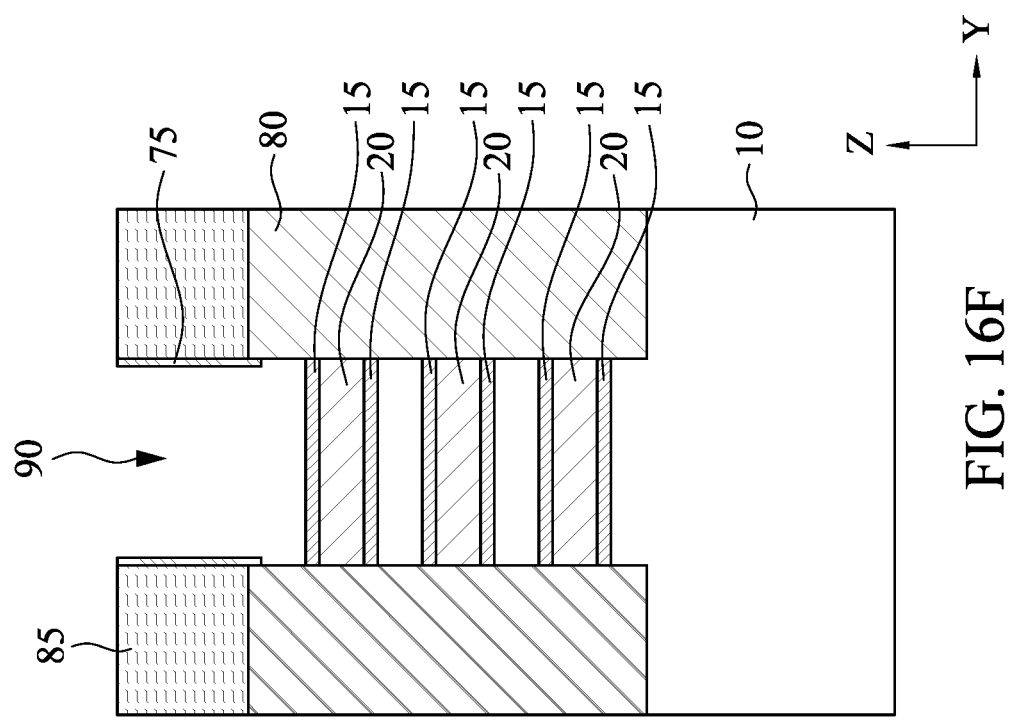
FIG. 16F is a cross sectional view taken along line B-B of FIG. 1 of an another embodiment.
Figure 16E:
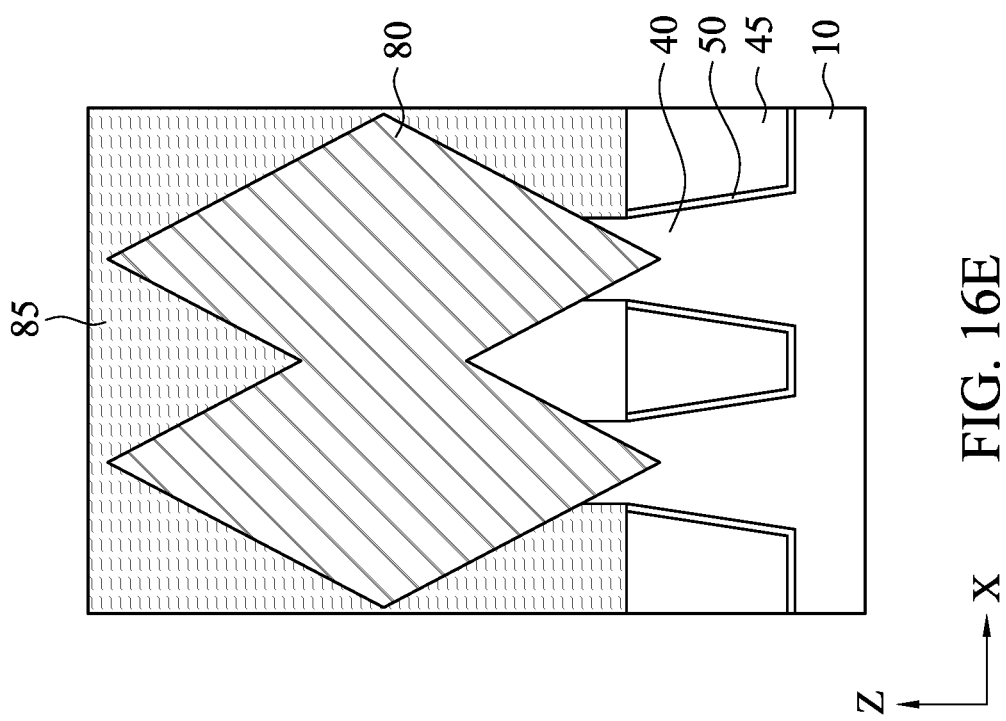
FIG. 16E is a cross sectional view taken along line C-C of FIG. 1

FIGS. 16E and 16F shows another embodiment, where the third semiconductor layers 25 are removed from the structure of FIG. 15F. FIG. 16E is a cross sectional view taken along line C-C of FIG. 1 and FIG. 16F is a cross sectional view taken along line B-B of FIG. 1

In some embodiments, a combination of dry etching techniques and wet etching techniques are used to remove the third semiconductor layer 25.

In another embodiment, the first and second semiconductor layers 15, 20 are removed by using suitable etching techniques, and nanowires made of the third semiconductor layer 25 are obtained.

The cross sectional shape of the semiconductor nanowires 15, 20 in the channel region are shown as rectangular, but can be any polygonal shape (triangular, diamond, etc.), polygonal shape with rounded corners, circular, or oval (vertically or horizontally).

Figure 17B:
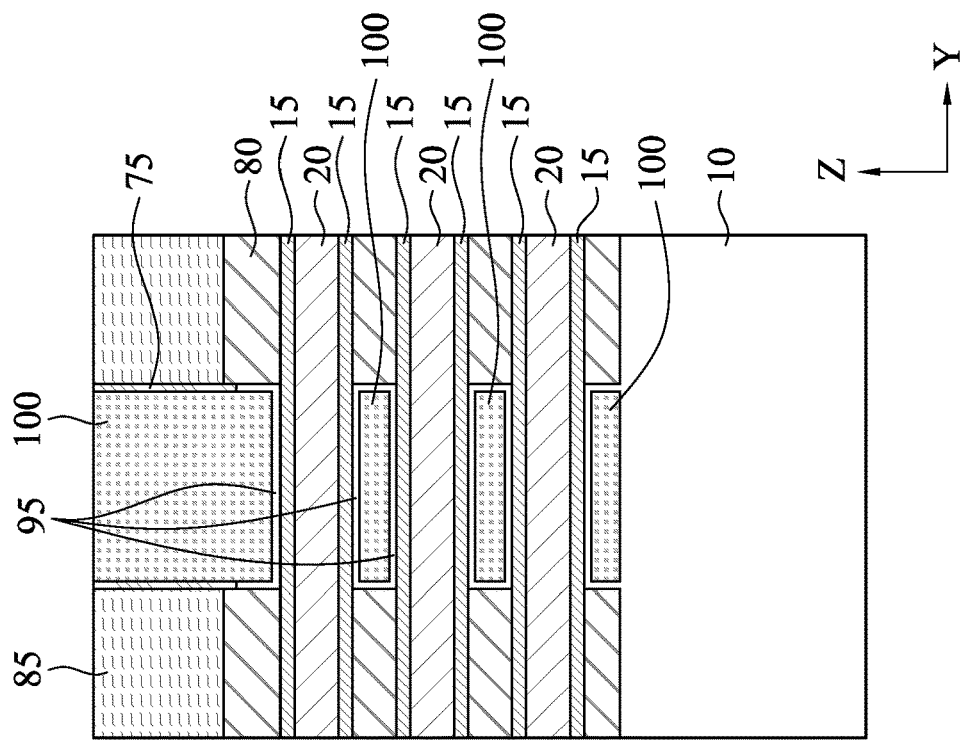
FIGS. 17A-17D show one of the various stages of manufacturing a semiconductor FET device according to embodiments of the present disclosure.
Figure 17A:
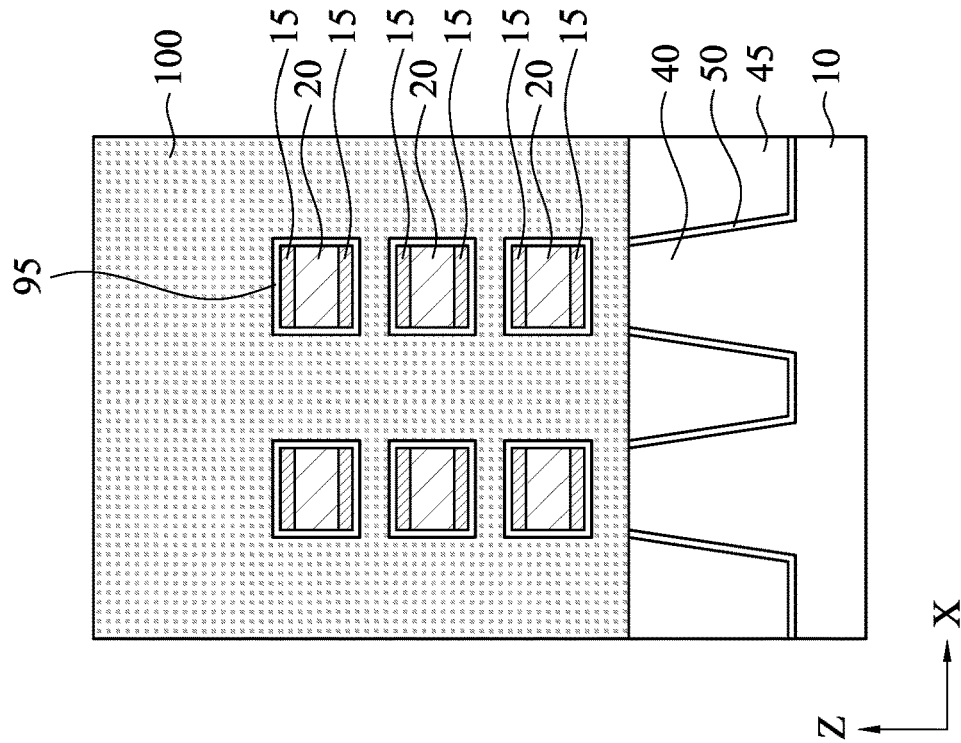
Figure 17D:
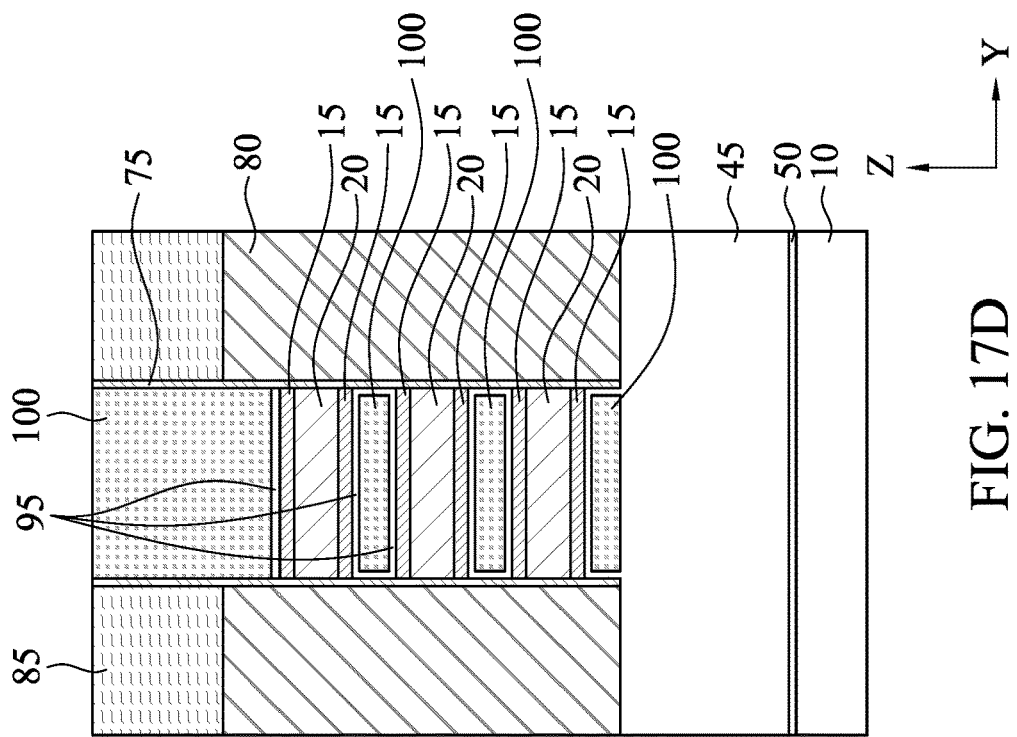
Figure 17C:
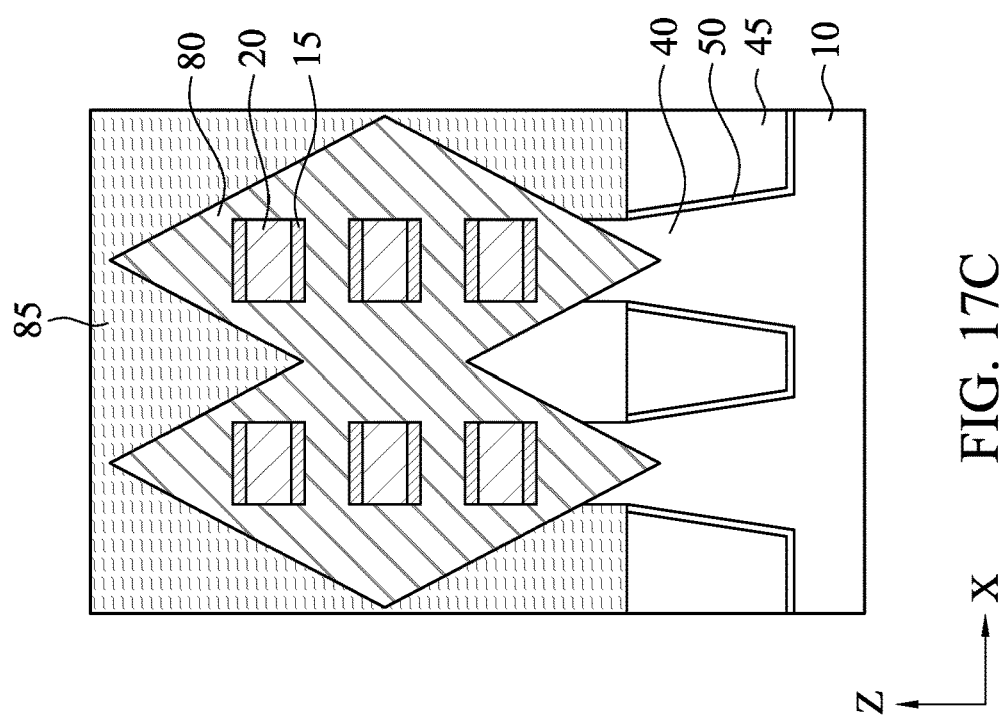

After the semiconductor nanowires of the first and second semiconductor layers 15, 20 are formed, a gate dielectric layer 95 is formed around each channel layers (wires of the first and second semiconductor layers 15, 20), and a gate electrode layer 100 is formed on the gate dielectric layer 95, as shown in FIGS. 17A-17D. FIG. 17A is a cross sectional view taken along the gate electrode in the X-direction (line A-A of FIG. 1). FIG. 17B is a cross sectional view taken along the fin structure in the Y-direction (line B-B of FIG. 1). FIG. 17C is a cross sectional view taken along line C-C of FIG. 1. FIG. 17D is a cross sectional view taken along line D-D of FIG. 1.

Figure 17F:
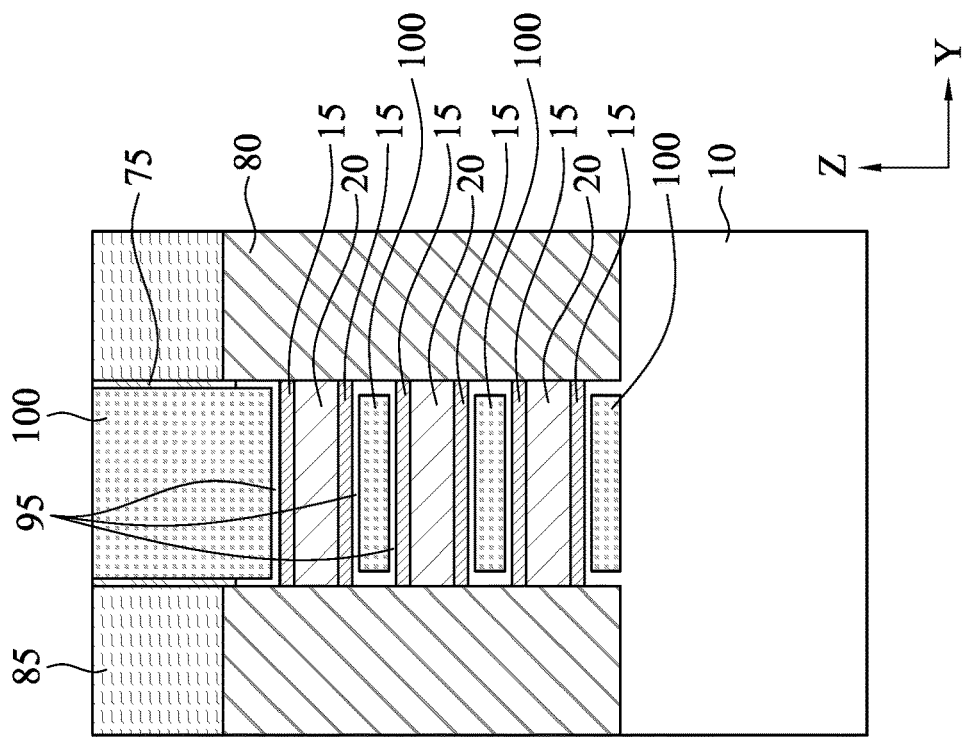
FIG. 17F is a cross sectional view taken along line B-B of FIG. 1 of an another embodiment.
Figure 17E:
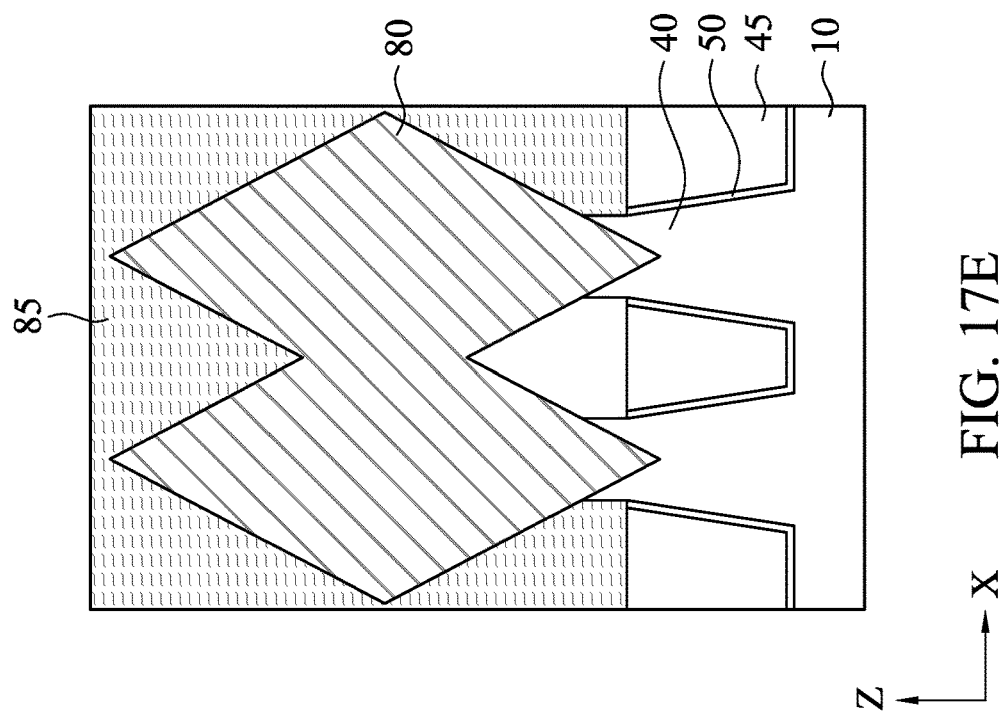
FIG. 17E is a cross sectional view taken along line C-C of FIG. 1

FIGS. 17E and 17F show another embodiment, where the gate dielectric layer 95 and gate electrode layer 100 are formed on the structure of FIG. 16F. FIG. 17E is a cross sectional view taken along line C-C of FIG. 1 and FIG. 17F is a cross sectional view taken along line B-B of FIG. 1.

In certain embodiments, the gate dielectric layer 95 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 95 includes an interfacial layer formed between the channel layers and the dielectric material.

The gate dielectric layer 95 may be formed by CVD, ALD, or any suitable method. In one embodiment, the gate dielectric layer 95 is formed using a highly conformal deposition process such as ALD in order to ensure the formation of a gate dielectric layer having a uniform thickness around each channel layers. The thickness of the gate dielectric layer 95 is in a range from about 1 nm to about 6 nm in some embodiments. In some embodiments, the gate dielectric layer 95 is also formed on the exposed source/drain epitaxial layers 80.

The gate electrode layer 100 is formed on the gate dielectric layer 95 to surround each channel layer. The gate electrode 100 includes one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 100 may be formed by CVD, ALD, electro-plating, or other suitable method. The gate electrode layer is also deposited over the upper surface of the ILD layer 85. The gate dielectric layer and the gate electrode layer formed over the ILD layer 85 are then planarized by using, for example, CMP, until the top surface of the ILD layer 85 is revealed. After the planarization operation, the gate electrode layer is recessed and a cap insulating layer (not shown) is formed over the recessed gate electrode in some embodiments. The cap insulating layer includes one or more layers of a silicon nitride-based material, such as $Si_3N_4$. The cap insulating layer can be formed by depositing an insulating material followed by a planarization operation.

In certain embodiments of the present disclosure, one or more work function adjustment layers (not shown) are interposed between the gate dielectric layer 95 and the gate electrode 100. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 18D:
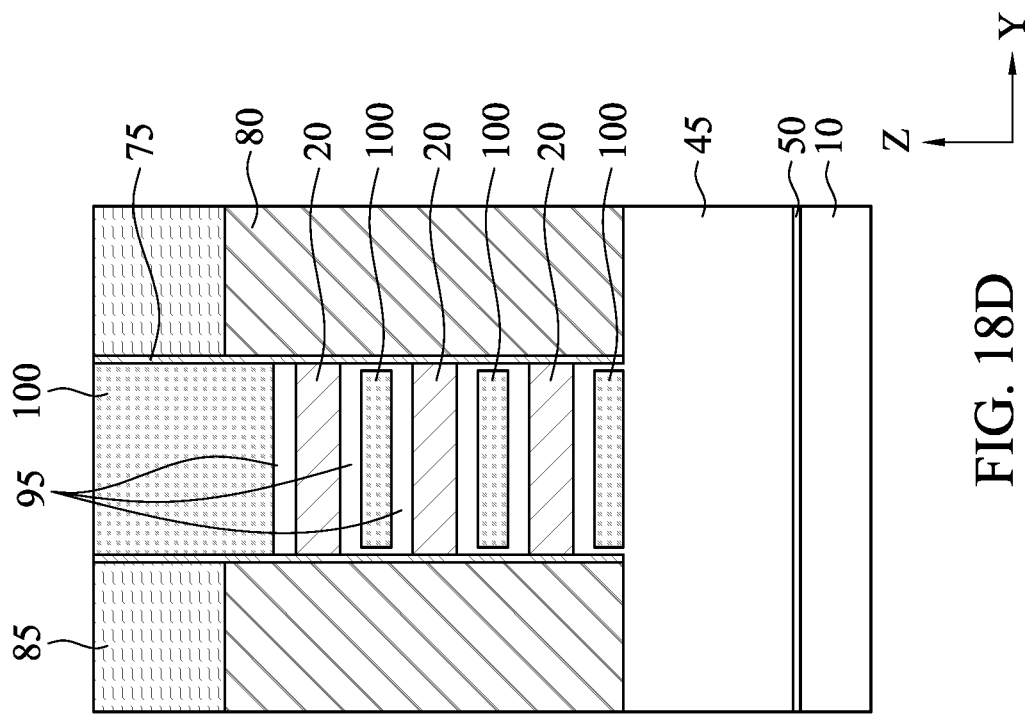
Figure 18C:
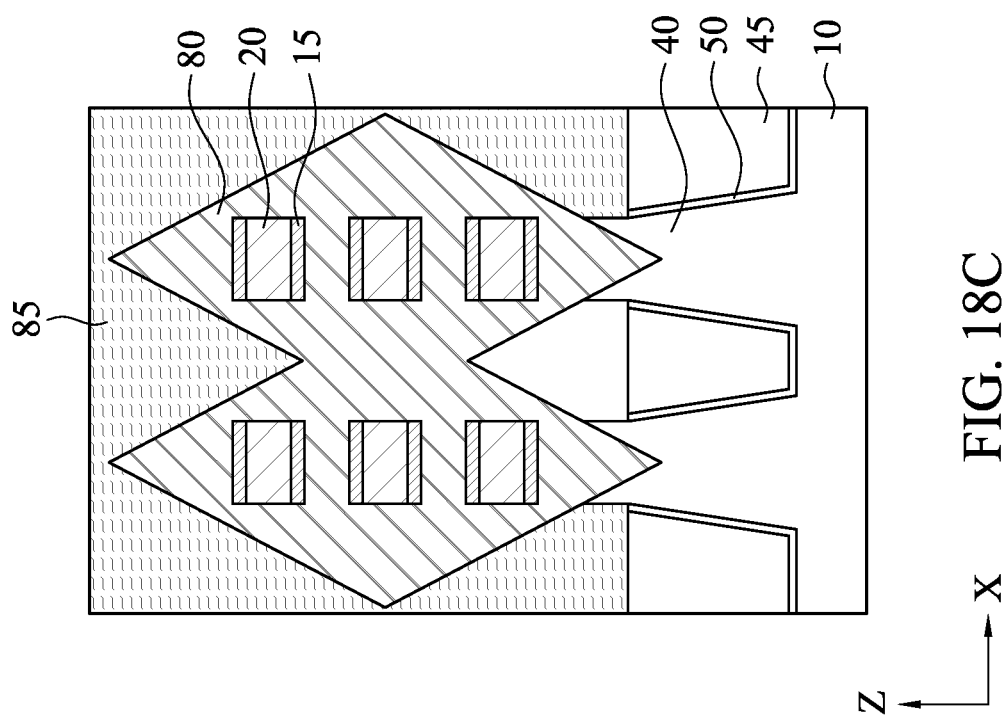

In other embodiments, the first semiconductor layers 15 disposed on opposing sides of the second semiconductor layer 20 are removed prior to forming the gate dielectric layer 95 and gate electrode layer 100, resulting in the structure shown in FIGS. 18A-18D. The first semiconductor layers 15 can be removed by a suitable etching operation, such as wet etching using HF:HNO$_3$:H$_2$O. FIG. 18A is a cross sectional view taken along the gate electrode in the X-direction (line A-A of FIG. 1). FIG. 18B is a cross sectional view taken along the fin structure in the Y-direction (line B-B of FIG. 1). FIG. 18C is a cross sectional view taken along line C-C of FIG. 1. FIG. 18D is a cross sectional view taken along line D-D of FIG. 1. The first semiconductor layers 15 disposed on opposing sides of the second semiconductor layer 20 are removed in only the channel region of by using a suitable etching technique. Therefore, the first semiconductor layers remain in the source/drain regions 80 in this embodiment.

Figure 18F:
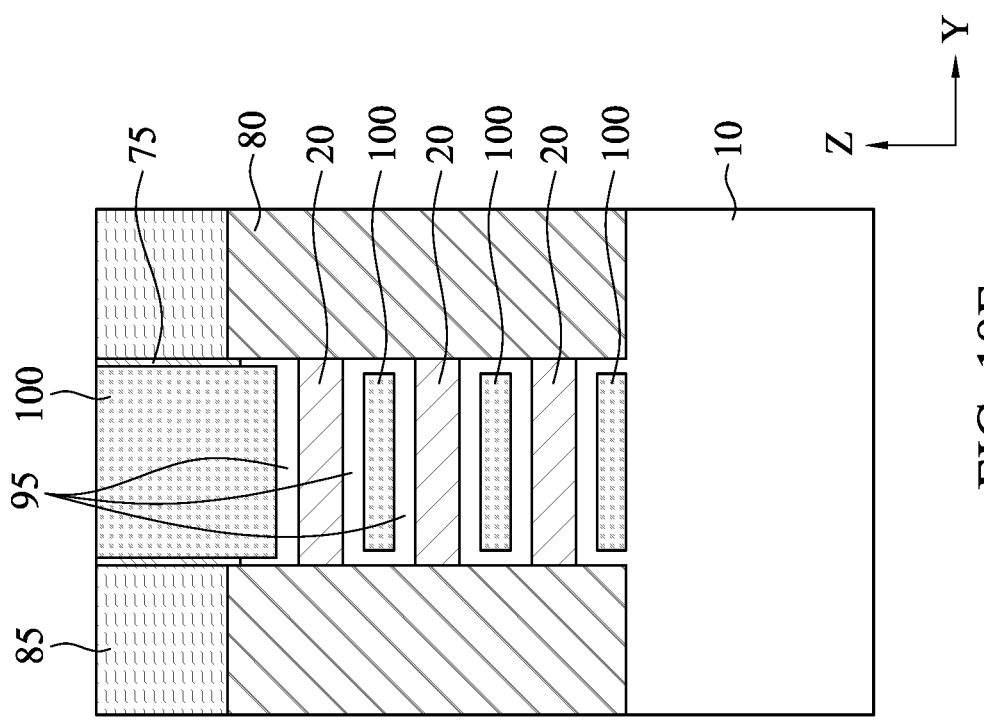
FIG. 18F is a cross sectional view taken along line B-B of FIG. 1 of an another embodiment.
Figure 18E:
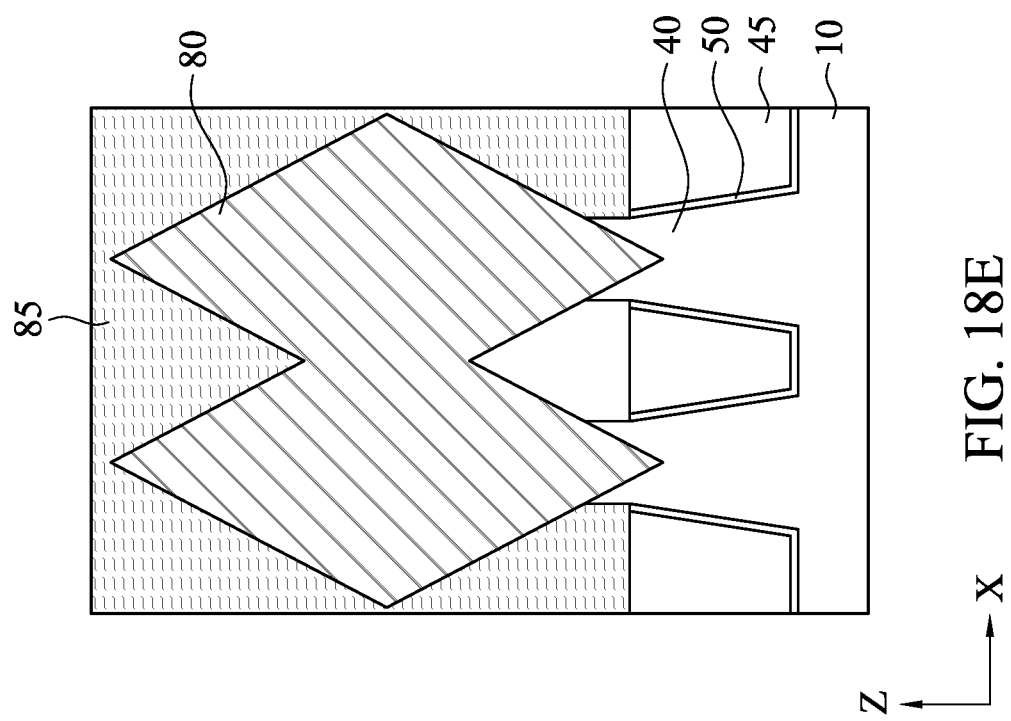
FIG. 18E is a cross sectional view taken along line C-C of FIG. 1

FIGS. 18E and 18F show another embodiment, where the fin structures in the source/drain regions are recessed down to about the upper surface of the isolation insulating layer 45, as shown in FIG. 12E and source/drain regions 80 are formed in the recess. FIG. 18E is a cross sectional view taken along line C-C of FIG. 1 and FIG. 18F is a cross sectional view taken along line B-B of FIG. 1.

Subsequently, contact holes (not shown) may be formed in the ILD layer 85 by using dry etching. In some embodiments, the upper portion of the S/D epitaxial layer 80 is etched. In some embodiments, a silicide layer is formed over the S/D epitaxial layer 80. The silicide layer includes one or more of WSi, CoSi, NiSi, TiSi, MoSi and TaSi. Then, a conductive material (not shown) is formed in the contact holes. The conductive material includes one or more of Co, Ni, W, Ti, Ta, Cu, Al, TiN and TaN. It is understood that the GAA FETs undergo further CMOS processes to form various features such as contacts/vias, interconnect metal layers, dielectric layers, passivation layers, etc.

In some embodiments shown in FIGS. 18A-18F each of the plurality of the nanowires 20 are separated by a greater distance in the nanowire stacking direction than each of the plurality of the nanowires 15, 20 in FIGS. 17A-17F.

In certain embodiments, the semiconductor device is an n-type GAA FET. In other embodiments, the semiconductor device is a p-type GAA FET. In some embodiments, one or more n-type GAA FETs and one or more p-type GAA FETs are provided on the same substrate 10.

In embodiments of the present disclosure, the first semiconductor layer disposed on opposing sides of the second semiconductor layer protects the second semiconductor layer during etching to remove the third semiconductor layer in the channel region. In some embodiment, the first SiGe semiconductor layer having a higher concentration of Ge than the second SiGe semiconductor layer has a high resistance against the etchant used to remove the Si third semiconductor layer, thereby protecting the second SiGe semiconductor layer from thinning during the third semiconductor layer etching operation. Semiconductor devices formed according to the present disclosure have an improved process window of nanowire release etching, leading to higher device yield.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

An embodiment of the present disclosure is a method of manufacturing a semiconductor device including forming a first semiconductor layer having a first composition over a semiconductor substrate, and forming a second semiconductor layer having a second composition over the first semiconductor layer. Another first semiconductor layer having the first composition is formed over the second semiconductor layer. A third semiconductor layer having a third composition is formed over the another first semiconductor layer. The first semiconductor layers, second semiconductor layer, and third semiconductor layer are patterned to form a fin structure. A portion of the third semiconductor layer is removed thereby forming a nanowire comprising the second semiconductor layer, and a conductive material is formed surrounding the nanowire. The first semiconductor layers, second semiconductor layer, and third semiconductor layer include different materials. In an embodiment, a stack of alternating first semiconductor layers, second semiconductor layers, another first semiconductor layers, and third semiconductor layers is formed by repeating, in order, forming the first semiconductor layer, forming the second semiconductor layer, forming the another first semiconductor layer, and forming the third semiconductor layer. In an embodiment, a sacrificial gate structure is formed over the fin structure before the removing a portion of the third semiconductor layer. In an embodiment, a portion of the fin structure, which is not covered by the sacrificial gate structure, is removed before the removing a portion of the third semiconductor layer, thereby forming a source/drain space. In an embodiment, source/drain regions are formed in the source/drain space. In an embodiment, a portion of the semiconductor substrate is removed when forming the nanowire. In an embodiment, the third semiconductor layer and the semiconductor substrate are formed of a same material. In an embodiment the same material is silicon. In an embodiment, the first semiconductor material is $Si_{1-x}Ge_x$, and the second semiconductor material is $Si_{1-y}Ge_y$, wherein x>y.

In another embodiment of the present disclosure, a method of manufacturing a semiconductor device includes forming a fin structure over a semiconductor substrate in which first semiconductor layers A, second semiconductor layers B, and third semiconductor layers C are stacked in a repeating sequence ABAC. The first semiconductor, second semiconductor, and third semiconductor layers include different materials. A sacrificial gate structure defines a gate region over the fin structure. The third semiconductor layers are removed from source/drain regions of the fin structure, which are not covered by the sacrificial gate structure. Source/drain epitaxial layers are formed in the source/drain regions. The sacrificial gate structure are removed, and the third semiconductor layers are removed from the gate region. A gate electrode structure is formed in the gate region, wherein the gate electrode structure wraps around the first and second semiconductor layers. In an embodiment, a portion of the semiconductor substrate is removed when the third semiconductor layers are removed. In an embodiment, the third semiconductor layer and the semiconductor substrate are formed of a same material. In an embodiment, the same material is a Group IV element. In an embodiment, the first semiconductor material is $Si_{1-x}Ge_x$, and the second semiconductor material is $Si_{1-y}Ge_y$, wherein x>y. In an embodiment, 0.3≤x≤0.9 and 0.1≤y≤0.5. In an embodiment, the first and second semiconductor layers are epitaxially formed and during the epitaxial operation the Ge concentration is increased to form the first semiconductor layer and the Ge concentration is reduced to form the second semiconductor layer. In an embodiment, a thickness of the second semiconductor layer is greater than a thickness of the third semiconductor layer.

In an embodiment of the present disclosure, a method of manufacturing a semiconductor device includes forming a first fin structure and a second fin structure, wherein in both the first fin structure and the second fin structure first semiconductor layers and second semiconductor layers are alternately stacked. A first sacrificial gate structure is formed over the first fin structure and a second sacrificial gate structure is formed over the second fin structure. A first protective layer is formed over the second fin structure and the second sacrificial gate structure. The first semiconductor layers in a source/drain region of the first fin structure, which is not covered by the first sacrificial gate structure, is removed thereby forming a first source/drain space. A first source/drain epitaxial layer is formed in the first source/drain space, thereby forming a first structure. A second protective layer is formed over the first fin structure and the first sacrificial gate structure. The second semiconductor layers in a source/drain region of the second fin structure, which is not covered by the second sacrificial gate structure, is removed thereby forming a second source/drain space. A second source/drain epitaxial layer in the second source/drain space is removed, thereby forming a second structure. The first sacrificial gate structure and the first semiconductor layer are removed in the first gate region to form a first gate space. The second sacrificial gate structure and the second semiconductor layer in the second gate region are removed to form a second gate space. First and second gate electrode structures are formed in the first and second gate spaces, respectively. The first semiconductor layer includes a first sublayer and second sublayers disposed on opposing sides of the first sublayer, the first sublayer formed of an alloy comprising a first Group IV element and a second Group IV element, and the second sublayers formed of an alloy comprising the first Group IV element and the second Group IV element. The amounts of the first Group IV element and second Group IV element is different in the first sublayer and the second sublayers. In an embodiment, the first Group IV element is Si and the second Group IV element is Ge. In an embodiment, the composition of the first sublayer is $Si_{1-y}Ge_y$, where $0.1 \leq y \leq 0.5$, and the composition of the second sublayers is $Si_{1-x}Ge_x$, where $0.3 \leq x \leq 0.9$.

In an embodiment of the present disclosure, a semiconductor device includes at least one semiconductor nanowire disposed over a semiconductor substrate, and a gate structure wrapping around the at least one semiconductor nanowire. Source/drain structures are disposed over the semiconductor substrate on opposing sides of the gate structure. At least one semiconductor nanowire comprises two opposing first layers composed of a first semiconductor material sandwiching a second layer of a second semiconductor material different from the first semiconductor material. In an embodiment, the first semiconductor material comprises a first Group IV element and a second Group IV element, the second semiconductor material comprises the first Group IV element and the second Group IV element, and the amounts of the first Group IV element and second Group IV element are different in the first semiconductor material and the second semiconductor material. In an embodiment, the first Group IV element is Si and the second Group IV element is Ge. In an embodiment, the first semiconductor material is $Si_{1-x}Ge_x$, the second semiconductor material is $Si_{1-y}Ge_y$, and x>y. In an embodiment, $0.3 \leq x \leq 0.9$, and $0.1 \leq y \leq 0.5$. In an embodiment, a thickness of the first layers is 0.5 nm to 2 nm, and a thickness of the second layer is 3 nm to 15 nm. In an embodiment, the source/drain structures wrap around the at least one nanowire. In an embodiment, insulating sidewalls are disposed between the source/drain structures and the gate structure. In an embodiment, the gate structure includes a high-k dielectric layer and a metal gate electrode layer.

In an embodiment of the present disclosure, a semiconductor device includes a plurality of semiconductor wires disposed over a substrate in a stack arranged along a first direction, the first direction extending substantially perpendicular to a main surface of the substrate. A first source/drain region is in contact with ends of the first semiconductor wires. A gate dielectric layer is disposed on and wraps around each channel region of the first semiconductor wires. A gate electrode layer is disposed on the gate dielectric layer and wraps around each channel region. At least one semiconductor nanowire includes two opposing first layers composed of a first semiconductor material sandwiching a second layer of a second semiconductor material different from the first semiconductor material, and the first layers and the second layer are arranged along the first direction. In an embodiment, the first semiconductor material includes a first Group IV element and a second Group IV element, the second semiconductor material includes the first Group IV element and the second Group IV element, and the amounts of the first Group IV element and second Group IV element are different in the first semiconductor material and the second semiconductor material. In an embodiment, the first Group IV element is Si and the second Group IV element is Ge. In an embodiment, the first semiconductor material is $Si_{1-x}Ge_x$, the second semiconductor material is $Si_{1-y}Ge_y$, and x>y. In an embodiment, a thickness of the first layers is 0.5 nm to 2 nm, and a thickness of the second layer is 3 nm to 15 nm. In an embodiment, the source/drain structures wrap around each of the nanowires. In an embodiment, insulating sidewalls are included between the source/drain region and the gate electrode layer.

In an embodiment of the present disclosure, a semiconductor device includes a first nanowire structure and a second nanowire structure, wherein both of the first nanowire structure and the second nanowire structure include a plurality of nanowires extending along a first direction and stacked along a second direction substantially perpendicular to the first direction. First and second gate electrodes are disposed over the first and second nanowire structures, respectively, wherein the first and second electrodes wrap around the nanowires of the first and second nanowires respectively. The first nanowires are composed of a first semiconductor layer including a first semiconductor material and second sublayers disposed on opposing sides of the first sublayer including a second semiconductor material. The second nanowires are composed of a third semiconductor material, and the first, second, and third semiconductor materials are different materials. In an embodiment, the first semiconductor material is an alloy including a first Group IV element and a second Group IV element, the second semiconductor material is an alloy including the first Group IV element and the second Group IV element, the third semiconductor material is one of the first and second Group IV elements, and the amounts of the first Group IV element and second Group IV element are different in the first semiconductor material and the second semiconductor material. In an embodiment, the first Group IV element is Si and the second Group IV element is Ge. In an embodiment, the composition of the first semiconductor material is $Si_{1-y}Ge_y$, where $0.1 \leq y \leq 0.5$, and the composition of the second semiconductor material is $Si_{1-x}Ge_x$, where $0.3 \leq x \leq 0.9$.

In an embodiment of the present disclosure, a method of manufacturing a semiconductor device includes forming a fin structure including a first first-semiconductor layer, a first second-semiconductor layer, a third semiconductor layer, a second second-semiconductor layer, and a second first-semiconductor layer, disposed in this order. A sacrificial gate structure including a sacrificial gate dielectric layer and a sacrificial gate electrode layer is formed overlying the fin structure. Source and drain regions are formed over the fin structure on opposing sides of the sacrificial gate structure. An interlayer dielectric layer is formed over the source/drain regions. The sacrificial gate structure is removed. The first semiconductor layers and the second semiconductor layers are removed in a channel region of the device thereby forming a nanowire of the third semiconductor layer. A high-k gate dielectric layer and a metal gate electrode are formed wrapping around the nanowire in the channel region.

It will be understood that not all advantages have been necessarily discussed herein, no particular advantage is required for all embodiments or examples, and other embodiments or examples may offer different advantages.

What is claimed is:

1. A semiconductor device comprising:
   at least one semiconductor nanowire disposed over a semiconductor substrate;
   a gate structure wrapping around the at least one semiconductor nanowire; and
   source/drain structures disposed over the semiconductor substrate on opposing sides of the gate structure,
   wherein the at least one semiconductor nanowire comprises two opposing first layers having a same composition of a first semiconductor material sandwiching a second layer of a second semiconductor material different from the first semiconductor material,
   the first semiconductor material comprises a first Group IV element and a second different Group IV element,
   the second semiconductor material comprises the first Group IV element and the second Group IV element, and
   the amounts of the first Group IV element and second Group IV element are different in the first semiconductor material and the second semiconductor material.

2. The semiconductor device of claim 1, wherein the first Group IV element is Si and the second Group IV element is Ge.

3. The semiconductor device of claim 2, wherein the first semiconductor material is $Si_{1-x}Ge_x$, the second semiconductor material $Si_{1-y}Ge_y$, and x>y.

4. The semiconductor device of claim 3, wherein $0.3 \leq x \leq 0.9$, and $0.1 \leq y \leq 0.5$.

5. The semiconductor device of claim 1, wherein a thickness of the first layers is 0.5 nm to 2 nm, and a thickness of the second layer is 3 nm to 15 nm.

6. The semiconductor device of claim 1, wherein the source/drain structures wrap around the at least one nanowire.

7. The semiconductor device of claim 1, further comprising insulating sidewalls between the source/drain structures and the gate structure.

8. The semiconductor device of claim 1, wherein the gate structure comprises a high-k dielectric layer and a metal gate electrode layer.

9. The semiconductor device of claim 1, wherein the second layer of the at least one semiconductor nanowire comprises is thicker than each of the two opposing first layers.

10. A semiconductor device, comprising:
    a plurality of semiconductor wires disposed over a substrate in a stack arranged along a first direction, the first direction extending substantially perpendicular to a main surface of the substrate;
    a first source/drain region in contact with ends of the first semiconductor wires;
    a gate dielectric layer disposed on and wrapping around each channel region of the first semiconductor wires; and
    a gate electrode layer disposed on the gate dielectric layer and wrapping around the each channel region,
    wherein the at least one semiconductor nanowire comprises two opposing first layers having a same composition of a first semiconductor material sandwiching a second layer of a second semiconductor material different from the first semiconductor material, the first layers and the second layer being arranged along the first direction,
    first semiconductor material comprises a first Group IV element and a second different Group IV element,
    the second semiconductor material comprises the first Group IV element and the second Group IV element, and
    the amounts of the first Group IV element and second Group IV element are different in the first semiconductor material and the second semiconductor material.

11. The semiconductor device of claim 10, wherein the first Group IV element is Si and the second Group IV element is Ge.

12. The semiconductor device of claim 11, wherein the first semiconductor material is $Si_{1-x}Ge_x$, the second semiconductor material is $Si_{1-y}Ge_y$, and x>y.

13. The semiconductor device of claim 10, wherein a thickness of the first layers is 0.5 nm to 2 nm, and a thickness of the second layer is 3 nm to 15 nm.

14. The semiconductor device of claim 10, wherein the source/drain structures wrap around each of the nanowires.

15. The semiconductor device of claim 10, further comprising insulating sidewalls between the source/drain region and the gate electrode layer.

16. The semiconductor device of claim 10, wherein the second layer of the at least one semiconductor nanowire is thicker than each of the two opposing first layers.

17. A semiconductor device, comprising:
    a first nanowire structure and a second nanowire structure, wherein both of the first nanowire structure and the second nanowire structure comprise a plurality of nanowires extending along a first direction and stacked along a second direction substantially perpendicular to the first direction; and
    first and second gate electrodes disposed over the first and second nanowire structures, respectively, wherein the first and second electrodes wrap around the nanowires of the first and second nanowires respectively,
    wherein the first nanowires are composed of a first semiconductor sublayer comprising a first semiconductor material and second sublayers disposed on opposing sides of the first semiconductor sublayer having a same composition of a second semiconductor material, the second nanowires are composed of a third semiconductor material, and the first, second, and third semiconductor materials are different materials, wherein the first semiconductor material is an alloy comprising a first Group IV element and a second Group IV element, the second semiconductor material is an alloy comprising the first Group IV element and the second Group IV element, the third semiconductor material is one of the first and second Group IV elements, and the amounts of the first Group IV element and second Group IV element are different in the first semiconductor material and the second semiconductor material.

18. The semiconductor device of claim 17, wherein the first Group IV element is Si and the second Group IV element is Ge.

19. The semiconductor device of claim 18, wherein the composition of the first semiconductor material is $Si_{1-y}Ge_y$, where $0.1 \leq y \leq 0.5$, and the composition of the second semiconductor material is $Si_{1-x}Ge_x$, where $0.3 \leq x \leq 0.9$.

20. The semiconductor device of claim 17, wherein the first semiconductor sublayer is thicker than each of the second sublayers.

\* \* \* \* \*